United States Patent
Rajamohanan et al.

(10) Patent No.: US 10,354,728 B2
(45) Date of Patent: Jul. 16, 2019

(54) WRITE VERIFICATION AND RESISTIVE STATE DETERMINATION BASED ON CELL TURN-ON CHARACTERISTICS FOR RESISTIVE RANDOM ACCESS MEMORY

(71) Applicant: SANDISK TECHNOLOGIES LLC, Plano, TX (US)

(72) Inventors: Bijesh Rajamohanan, San Jose, CA (US); Juan Pablo Saenz, Menlo Park, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 9 days.

(21) Appl. No.: 15/635,935

(22) Filed: Jun. 28, 2017

(65) Prior Publication Data
US 2019/0006005 A1   Jan. 3, 2019

(51) Int. Cl.
G11C 13/00   (2006.01)

(52) U.S. Cl.
CPC ...... *G11C 13/0064* (2013.01); *G11C 13/0007* (2013.01); *G11C 13/0028* (2013.01); *G11C 13/0069* (2013.01); *G11C 13/004* (2013.01); *G11C 2013/0083* (2013.01); *G11C 2213/71* (2013.01)

(58) Field of Classification Search
CPC .............. G11C 13/0064; G11C 13/004; G11C 13/0069
See application file for complete search history.

(56) References Cited

U.S. PATENT DOCUMENTS

| 5,915,167 | A | 6/1999 | Leedy |
| 8,861,258 | B2 | 10/2014 | Lan et al. |
| 9,047,948 | B1* | 6/2015 | Dinh ............... G11C 11/5614 |
| 9,343,507 | B2 | 5/2016 | Takaki |

(Continued)

FOREIGN PATENT DOCUMENTS

WO   WO2007004843 A1   1/2007

OTHER PUBLICATIONS

Endoh et al., "Novel Ultra High Density Memory with a Stacked-Surrounding Gate Transistor (S-SGT) Structured Cell," IEDM Proc., (2001), 33-36.

*Primary Examiner* — Mushfique Siddique
(74) *Attorney, Agent, or Firm* — The Marbury Law Group PLLC

(57) ABSTRACT

After programming a set of resistive memory cells in a resistive memory device, the programmed states and the functionality of each resistive memory cell in the programmed set can be verified by a primary determination method and a secondary determination method. The primary determination method employs the step of determining whether a measured electrical current at a preset read voltage for the selected resistive memory cell is within electrical current specification for the selected resistive state. If the selected cell fails the primary determination method, the second determination method is performed, which includes determining whether a measured threshold voltage for the selected resistive memory cell is within threshold voltage specification for the selected resistive state. If the selected cell fails both methods, the selected cell is identified as a non-functional resistive memory cell. Otherwise, the selected cell is identified as an operational cell.

15 Claims, 18 Drawing Sheets

(56) References Cited

U.S. PATENT DOCUMENTS

| | | | |
|---|---|---|---|
| 9,806,256 B1* | 10/2017 | Wu | H01L 45/124 |
| 2004/0042274 A1 | 3/2004 | Low et al. | |
| 2004/0160807 A1 | 8/2004 | Rinerson et al. | |
| 2004/0223393 A1 | 11/2004 | Hush et al. | |
| 2005/0052892 A1 | 3/2005 | Low et al. | |
| 2005/0128840 A1 | 6/2005 | Rinerson | |
| 2005/0180208 A1 | 8/2005 | Hush et al. | |
| 2006/0028872 A1 | 2/2006 | Rolandi et al. | |
| 2007/0103972 A1 | 5/2007 | Ro et al. | |
| 2008/0316808 A1* | 12/2008 | Herner | G11C 11/36 365/175 |
| 2009/0219749 A1 | 9/2009 | Lamorey et al. | |
| 2009/0290411 A1* | 11/2009 | Xi | G11C 11/5664 365/163 |
| 2011/0007551 A1* | 1/2011 | Tian | G11C 11/16 365/148 |
| 2011/0007552 A1 | 1/2011 | Ahn et al. | |
| 2011/0116312 A1 | 5/2011 | Lam et al. | |
| 2011/0188293 A1 | 8/2011 | Tian et al. | |
| 2012/0218807 A1 | 8/2012 | Johnson | |
| 2012/0268980 A1 | 10/2012 | Awaya et al. | |
| 2013/0043455 A1 | 2/2013 | Bateman | |
| 2013/0170283 A1* | 7/2013 | Lan | G11C 13/0007 365/148 |
| 2013/0235648 A1* | 9/2013 | Kim | G11C 13/0069 365/148 |
| 2013/0294148 A1 | 11/2013 | Johnson | |
| 2013/0308369 A1 | 11/2013 | Lu et al. | |
| 2014/0160832 A1 | 6/2014 | Ito | |
| 2014/0169066 A1* | 6/2014 | Ramaswamy | G11C 13/004 365/148 |
| 2014/0233299 A1* | 8/2014 | Lan | G11C 13/0064 365/148 |
| 2014/0233327 A1* | 8/2014 | Chen | G11C 7/00 365/189.09 |
| 2014/0278160 A1* | 9/2014 | Wei | G11C 29/50 702/58 |
| 2015/0052416 A1* | 2/2015 | Prohofsky | G06F 11/1048 714/773 |
| 2015/0206583 A1 | 7/2015 | Chou et al. | |
| 2015/0220273 A1 | 8/2015 | Sun et al. | |
| 2016/0020389 A1* | 1/2016 | Ratnam | G11C 13/004 257/2 |
| 2016/0125956 A1* | 5/2016 | Magia | G06F 3/0619 714/719 |
| 2017/0123724 A1* | 5/2017 | Park | G06F 3/0604 |
| 2018/0182455 A1* | 6/2018 | Zaitsu | G11C 13/0064 |

\* cited by examiner

WRITE VERIFICATION AND RESISTIVE STATE DETERMINATION BASED ON CELL TURN-ON CHARACTERISTICS FOR RESISTIVE RANDOM ACCESS MEMORY

FIELD

The present disclosure relates generally to the field of semiconductor devices and specifically to determining a resistive state of a resistive random access memory (ReRAM) device based on cell turn-on characteristics.

BACKGROUND

Resistance Random Access Memory, or "ReRAM," is a non-volatile memory device employing reversible change in resistance in a thin film with application of electrical voltage bias across the film. Thus, data can be stored in a ReRAM cell by changing the resistance of the thin film, which can be a solid-state material. The thin film is referred to as a memory film or a read/write film. Examples of ReRAM devices are described in World Intellectual Property Organization (WIPO) Publication No. WO2007004843 A1 to Hong et al. and U.S. Patent Application Publication No. 2013/0043455 A1 to Bateman.

A resistive memory cell can be programmed into a set state having a low electrical resistance, or a reset state having a high resistance. A write operation stores data in a set of resistive memory cells by programming each resistive memory cell into a set state or a reset state depending on the contents of the data. For example, "1" can correspond to a set state and "0" can correspond to a reset state, or vice versa. The write operation is typically followed by a write verification operation that compares the data read from the data-containing resistive memory cells with the original data. A suitable sense margin is employed to ensure that each set state provides electrical current greater than a minimum set current under a read bias condition, and each reset state provides electrical current less than a maximum reset current that is less than the minimum set current under the read bias condition. Intermediate measured electrical current between the maximum reset current and the minimum set current is considered to be an indication of a failed memory cell, triggering marking of resistive memory cells providing such intermediate measured electrical current under the read bias condition as "bad" or "non-operational" cells. Such marking of cells as "bad" decreases the amount of total cells available for data storage.

SUMMARY

According to an aspect of the present disclosure, a method of operating a resistive memory device is provided. A resistive memory device including an array of resistive memory cells is provided. Each of the resistive memory cells comprises a resistive memory material having at least two different resistive states. A selected resistive memory cell is programmed with a selected resistive state. A programmed state of the selected resistive memory cell is verified by: determining whether a measured electrical current at a preset read voltage for the selected resistive memory cell is within electrical current specification for the selected resistive state; if the measured electrical current at the preset read voltage is out of specification, then determining whether a measured threshold voltage for the selected resistive memory cell is within threshold voltage specification for the selected resistive state; identifying the selected resistive memory cell as an operational resistive memory cell if at least one of the measured electrical current and the measured threshold voltage is within a respective specification for the selected resistive state; and identifying the selected resistive memory cell as a non-functional resistive memory cell if both the measured electrical current and the measured threshold voltage are outside the respective specification for the selected resistive state.

According to another aspect of the present disclosure, a resistive memory device is provided, which comprises: an array of resistive memory cells, wherein each of the resistive memory cells comprises a resistive memory material having at least two different resistive states; a sense amplifier circuitry configured to detect a resistive state of each resistive memory cell within the array of resistive memory cells based on measurement of electrical current through a respective resistive memory cell upon application of a read bias voltage to the array of resistive memory cells; a threshold voltage extraction circuitry configured to determine a threshold voltage for each selected resistive memory cell among the array of resistive memory cells; and a write verification program controller configured to verify programmed states of a set of resistive memory cells by running an automated program that operates the sense amplifier circuitry and the threshold voltage extraction circuitry. The automated program performs the steps of: determining whether a measured electrical current at a preset read voltage for a selected resistive memory cell is within electrical current specification for the selected resistive state; determining, if measured electrical current at the preset read voltage is out of specification, then determining whether a measured threshold voltage for the selected resistive memory cell is within threshold voltage specification for the selected resistive state; identifying the selected resistive memory cell as an operational resistive memory cell if at least one of the measured electrical current and the measured threshold voltage is within a respective specification for the selected resistive state; and identifying the selected resistive memory cell as a non-functional resistive memory cell if both the measured electrical current and the measured threshold voltage are outside the respective specification for the selected resistive state.

DETAILED DESCRIPTION

Figure 1:
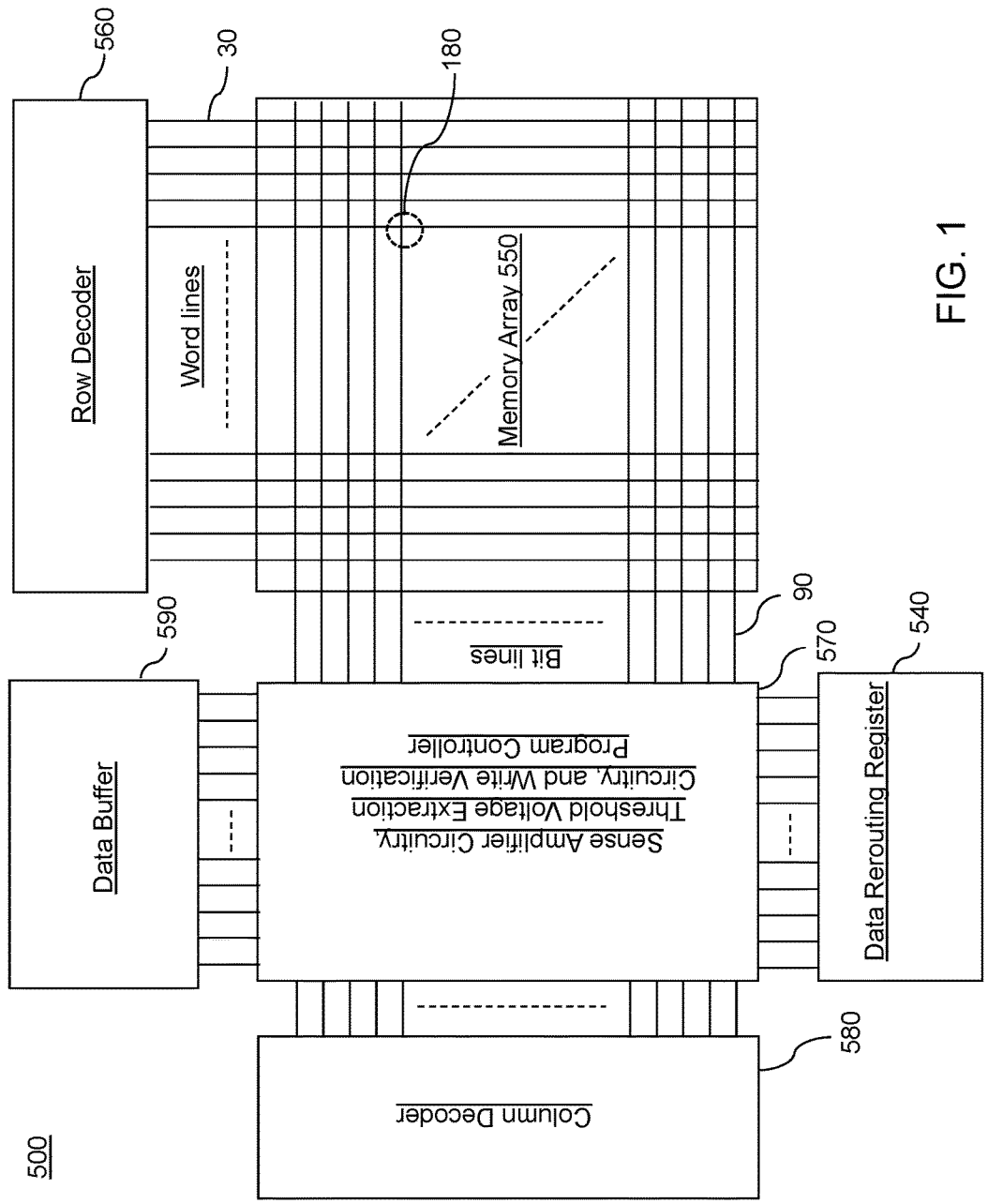
FIG. 1 is a schematic diagram of a memory device including resistive memory cells of the present disclosure in an array configuration.

As discussed above, the present disclosure is directed to a three-dimensional resistive random access memory (ReRAM) devices and other three-dimensional devices, and methods of making the same, the various aspects of which are described below. The embodiments of the disclosure can be employed to form various semiconductor devices such as three-dimensional monolithic memory array devices comprising ReRAM devices. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "resistive memory material" or a "reversibly resistance-switching material" is a material of which the resistivity can be altered by application of a voltage across the material. As used herein, a "resistive memory material layer" refers to a layer including a resistive memory material. As used herein, a "resistive memory element" refers to an element that includes a portion of a resistive memory material in a configuration that enables programming of the resistive memory material into at least two states having different values of electrical resistance.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays.

Referring to FIG. 1, a schematic diagram is shown for a non-volatile memory device including non-volatile memory cells of the present disclosure in an array configuration. The non-volatile memory device can be configured as a resistive random access memory device. As used herein, a "random access memory device" refers to a memory device including memory cells that allow random access, i.e., access to any selected memory cell upon a command for reading the contents of the selected memory cell. As used herein, a "resistive random access memory device" refers to a random access memory device in which the memory cells include a resistive memory element.

The resistive random access memory device 500 of the present disclosure includes a memory array region 550 containing an array of the respective memory cells 180 located at the intersection of the respective word lines (which may be embodied as first electrically conductive lines 30 as illustrated or as second electrically conductive lines 90 in an alternate configuration) and bit lines (which may be embodied as second electrically conductive lines 90 as illustrated or as first electrically conductive lines 30 in an alternate configuration). The device 500 may also contain a data rerouting register 540, a row decoder 560 connected to the word lines, sense circuitry 570 (e.g., a sense amplifier and other bit line control circuitry) connected to the bit lines, a column decoder 580 connected to the bit lines and a data buffer 590 connected to the sense circuitry. Multiple instances of the resistive memory cells 180 are provided in an array configuration that forms the random access memory device 500. It should be noted that the location and interconnection of elements are schematic and the elements may be arranged in a different configuration.

Each resistive memory cell 180 includes a resistive memory material having at least two different resistive states. The resistive memory material portion is provided between a first electrode and a second electrode within each resistive memory cell 180. Configurations of the resistive memory cells 180 are described in detail in subsequent sections. The resistive memory material portion may be selected from: (i) a non-filamentary barrier modulated cell (BMC) which includes a barrier and an electrically conductive metal oxide whose resistivity is switched by at least one of oxygen ion and/or oxygen vacancy diffusion in response to an application of an electric field thereto, as will be described in more detail below with respect to FIGS. 8A and 8B; (ii) a phase change material portion providing at least two different levels of resistivity that depend on crystallinity; or (iii) a filamentary metal oxide portion (e.g., hafnium oxide layer) providing at least two different levels of resistivity depending on concentration of conductive filaments therein.

The sense circuitry 570 includes sense amplifier circuitry (e.g., a "sense amp"), threshold voltage extraction circuitry, and write verification program controller. The sense circuitry is configured to measure a resistive state of each of the resistive memory cells 180 through respective bit lines. For example, the sense amplifier circuitry can be configured to detect a resistive state of each resistive memory cell 180 within the array of resistive memory cells based on measurement of electrical current through a respective resistive memory cell 180 upon application of a read bias voltage to the array of resistive memory cells 180. The threshold voltage extraction circuitry can be configured to determine a threshold voltage for each selected resistive memory cell 180 among the array of resistive memory cells 180. The write verification program controller can be configured to verify programmed states of a set of resistive memory cells 180 by running an automated program.

The automated program can include steps that operate the sense amplifier circuitry and the threshold voltage extraction circuitry to perform various steps. The various steps of can include a step of determining whether a measured electrical current at a preset read voltage for a selected resistive memory cell 180 is within electrical current specification (e.g., predetermined current range) for the selected resistive state; a step of determining, in case the measured electrical current at the preset read voltage is outside specification (e.g., outside the predetermined current range), whether a measured threshold voltage for the selected resistive memory cell 180 is within threshold voltage specification for the selected resistive state; a step of identifying the selected resistive memory cell 180 as an operational resistive memory cell if at least one of the measured electrical current and the measured threshold voltage is within a respective specification for the selected resistive state; and identifying the selected resistive memory cell 180 as a non-functional resistive memory cell (i.e., as a "bad" or "inoperative" cell) if both the measured electrical current and the measured threshold voltage are outside the respective specification for the selected resistive state.

The data rerouting register 540 can be in communication with the sense and verification circuitry 570. The data rerouting register 540 can keep record of the non-functional resistive memory cells and the location of data that is re-routed from the non-functional resistive memory cells. For example, the data rerouting register 540 can include a non-functional cell address register and a rewritten data address register. The non-functional cell address register can keep the record of all non-functional memory cells as identified by the sense and verification circuitry 570 during write verification. The rewritten data address register can keep the record of all addresses that is employed in place of the non-functional memory cells.

Figure 2A:
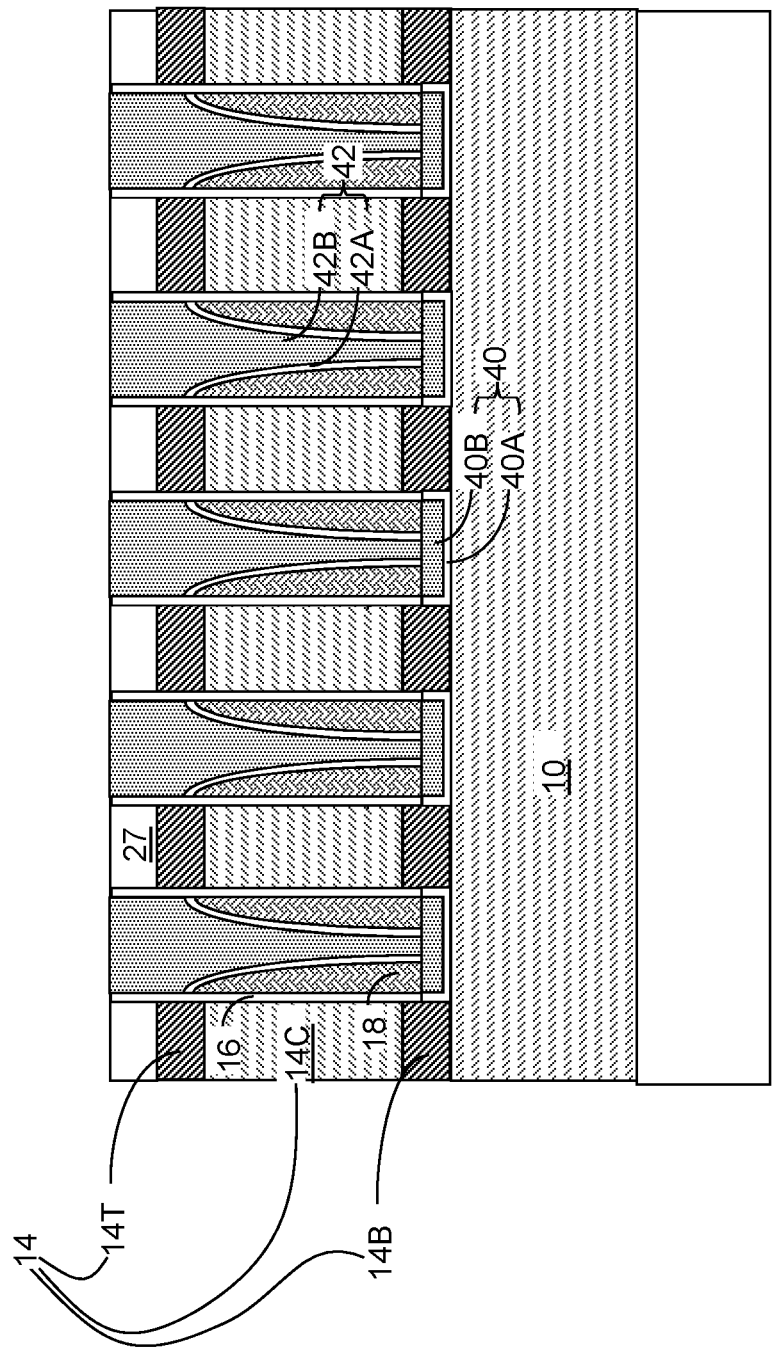
FIG. 2A is a vertical cross-sectional view of an exemplary structure after formation of bit line access transistors and dielectric fill layers according to an embodiment of the present disclosure.
Figure 2B:
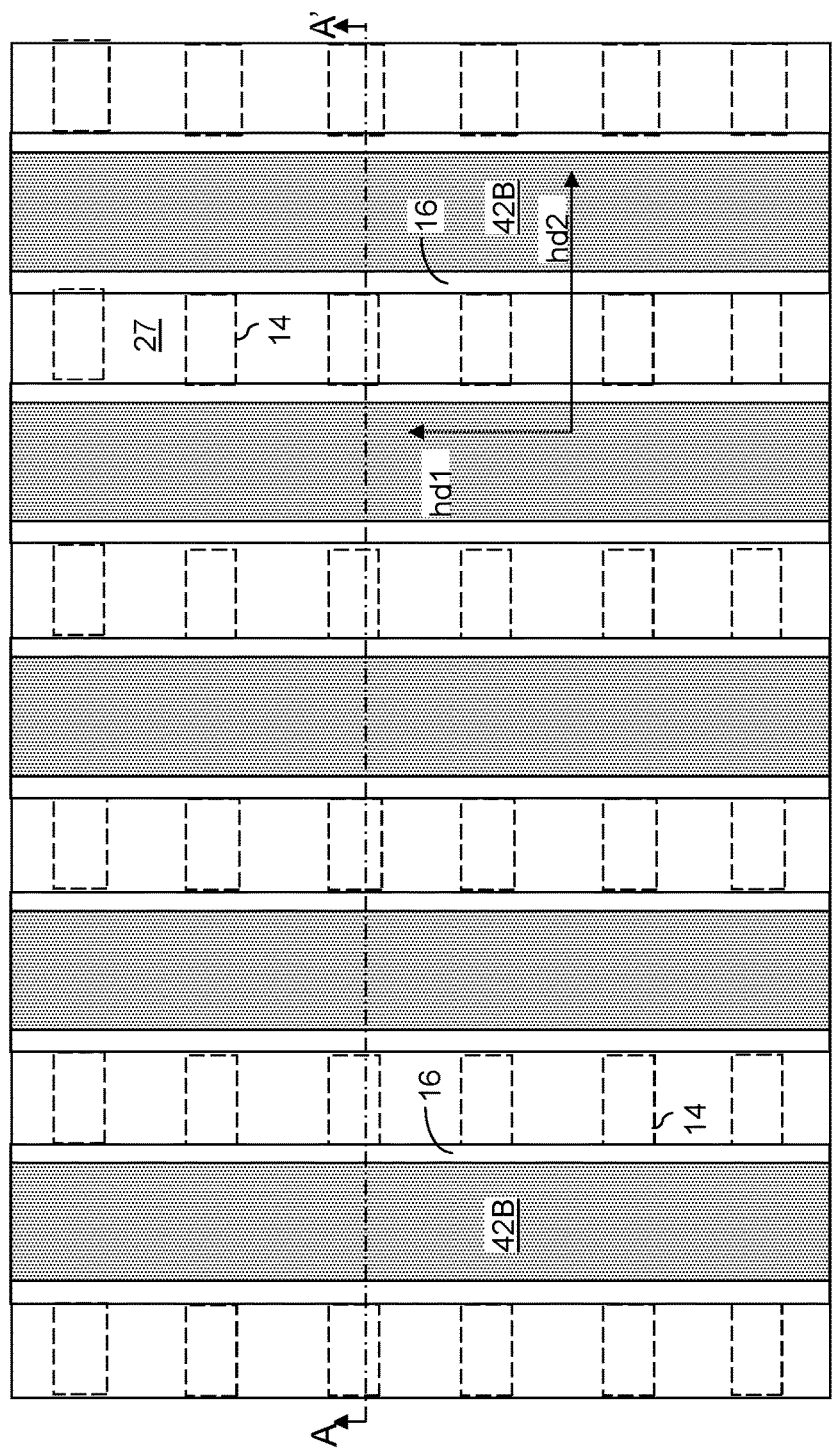
FIG. 2B is a see-through top-down view of the exemplary structure of FIG. 2A. The vertical plane A-A' is the plane of the cross-section for FIG. 2A.

Referring to FIGS. 2A and 2B, an exemplary structure according to a first embodiment is illustrated, which can be an in-process ReRAM device. The ReRAM device illustrated in FIGS. 2A to 6C has three-dimensional vertical bit line ("VBL") type device configuration. Other device configurations, such as pillar/cross bar configurations may also be used, as will be described in more detail below. As used herein, a "prototype" structure or an "in-process" structure refers to a transient structure that is subsequently modified in the shape or composition of at least one component therein.

The exemplary structure includes a substrate 6, which includes an insulating layer at an upper portion thereof. In one embodiment, the substrate 6 can be a stack of at least two material layers such as a stack of an underlying substrate material layer and an overlying substrate insulating layer. The substrate material layer can be a semiconductor material layer, a conductive material layer, or an insulating material layer that can provide structural support to the overlying structures, and may have a thickness greater than 50 microns, and typically in a range between 300 microns and 3 mm. In one embodiment, the substrate material layer can be a semiconductor wafer, such as a silicon wafer as known in the art. The substrate insulating layer can include an insulating material, and can have a thickness in a range from 100 nm to 3 microns, although lesser and greater thicknesses can also be employed.

In case the substrate material layer includes a semiconductor material, peripheral semiconductor devices for operation of a memory array device can be formed in, or on, the substrate material layer. For example, sense amplifiers, input-output (I/O) circuitry, control circuitry, and any other necessary peripheral circuitry can be formed on, or in, the substrate material layer. Additional devices that can be formed in, or on, the substrate material layer include, but are not limited to, global bit line select transistors for selecting global bit lines to be activated, local bit line select transistors for selecting local bit lines to be activated, and word line select transistor for selecting word lines to be activated.

Global bit lines 10 are formed over the substrate 6. The global bit lines 10 are parallel electrically conductive lines that are laterally spaced apart in a first horizontal direction hd1, and extending in a second horizontal direction hd2. The global bit lines 10 can be formed, for example, by depositing at least one conductive material layer, and patterning the at least one conductive material layer employing a combination of lithographic methods and an anisotropic etch. The at least one conductive material layer can include, for example, at least one elemental metal (such as W, Co, Cu, and Al), a conductive doped semiconductor material, an intermetallic alloy including at least two elemental metals, a conductive metallic nitride, or a conductive metallic carbide. For example, the at least one conductive material layer can include a metallic barrier layer (such as a layer of TiN, TaN, or WN) and a metal layer (such as a layer of W, Ti, Ta, Cu, Al, or an alloy thereof). The space between the global bit lines 10 can be filled with a dielectric material (such as silicon oxide). The dielectric material can be subsequently planarized to remove excess portions from above a horizontal plane including the top surfaces of the global bit lines 10 to form separator dielectric material portions (not shown). A one-dimensional array of the global bit lines 10 and the separator dielectric material portions can extend along the second horizontal direction hd2. Alternatively, the one-dimensional array of the global bit lines 10 and the separator dielectric material portions may be formed by depositing a dielectric material layer, forming trenches extending along the second horizontal direction hd2 and laterally spaced from one another along the first horizontal direction hd1, and filling the trenches with at least one conductive material to form the global bit lines 10 therein.

A two-dimensional array of select devices can be formed on the global bit lines 10 such that multiple select devices are formed on each global bit line 10. In one embodiment, the select devices can be transistor such as vertical thin film transistors employing a polycrystalline semiconductor channel. Examples of suitable transistors for the select devices are described, for example, in U.S. patent application Ser. No. 14/206,196, filed Mar. 12, 2014, which is incorporated by reference herein in its entirety. In case the select devices are field effect transistors, the select transistors are herein referred to access transistors.

The access transistors are subsequently formed on global bit line 10. Each access transistor can be a vertical field effect transistor, and can include a bottom active region 14B (which can be a source region or a drain region), a semiconductor channel 14C, and a top active region 14T (which can be a drain region if the underlying bottom active region 14B is a source region, and a source region if the underlying bottom active region 14C is a drain region). As used herein, an "active region" refers to a source region or a drain region.

A semiconductor layer stack (14T, 14C, 14B) is formed over the top surfaces of the global bit lines 10 and the separator dielectric material portions. The semiconductor layer stack includes a first conductivity type semiconductor layer, a channel material layer including a semiconductor material, and a second conductivity type semiconductor layer having a same type of doping as the first conductivity type semiconductor layer. Subsequently, an optional sacrificial matrix layer 27 (e.g., a sacrificial cap) can be formed on the top surface of the semiconductor layer stack. The sacrificial matrix layer can include, for example, organosilicate glass, a semiconductor material, or other sacrificial material that can be subsequently removed selective to the second conductivity type semiconductor layer.

The sacrificial matrix layer and the semiconductor layer stack are subsequently patterned into a one-dimensional array of rail structures extending along the first horizontal direction hd1. The rail structures include patterned remaining portions of the sacrificial matrix layer and the semiconductor layer stack, and are laterally spaced apart by trenches that extend along the first horizontal direction hd1. The first horizontal direction hd1 can be perpendicular to the second horizontal direction hd2 along which the global bit lines 10 extend.

A spacer dielectric portion 40 can be formed at the bottom of each trench. Each spacer dielectric portion 40 can be formed over of the global bit lines 10 and the separator dielectric material portions such that the top surface of the spacer dielectric portion 40 is located at a target height for placing a bottom edge of gate electrodes 18 to be subsequently formed. For example, the top surface of the spacer dielectric portion 40 can be at a level about the interface between the remaining portions of the first conductivity type semiconductor layer and the channel material layer. In one embodiment, each spacer dielectric portions 40 can include a vertical stack of a first spacer dielectric portion 40A and a second spacer dielectric portion 40B. The first spacer dielectric portion 40A can be deposited by a conformal deposition method, and the second spacer dielectric portion 40B can be deposited by a self-planarizing deposition method (such as spin coating). Portions of the first spacer dielectric portion 40A that protrudes above the top surface of the second spacer dielectric portion 40B can be removed, for example, by a selective etch that removes the material of the first spacer dielectric portion 40A selective to the material of the second spacer dielectric portion 40B. In one embodiment, the first spacer dielectric portion 40A can include silicon nitride, the second spacer dielectric portion 40B can include silicon oxide, and the selective etch can be a wet etch process that employs hot phosphoric acid.

The gate dielectrics 16 and the gate electrodes 18 of the access transistors can be subsequently formed, for example, by depositing a conformal gate dielectric layer (e.g., silicon oxide) and a conformal conductive material layer (e.g., heavily or degenerately doped polysilicon) in the trenches that separate the one-dimensional array of rail structures, and by anisotropically etching the conformal conductive material layer. The remaining vertical portions of the conformal conductive material layer constitute the gate electrodes 18, which extend along the first horizontal direction hd1. Each remaining portion of the conformal gate dielectric layer constitutes a gate dielectric 16. Each gate electrode 18 is laterally spaced from an adjacent rail structure by a vertical portion of a gate dielectric 16.

Remaining volumes of the trenches are filled with at least one dielectric material. Excess portions of the at least one dielectric material can be removed from above the horizontal plane including the top surfaces of the rail structures (which include remaining portions of the semiconductor layer stack and the sacrificial matrix layer) by a planarization process, which can employ, for example, chemical mechanical planarization. Each remaining portion of the deposited dielectric material in the trenches constitutes a dielectric rail structure 42.

Each dielectric rail structure 42 extends along the first horizontal direction hd1 parallel to the rail structures that include the remaining portions of the semiconductor layer stack and the sacrificial matrix layer. Each dielectric rail structure 42 can have a tapered bottom portion in which the width of the dielectric rail structure 42 monotonically or strictly increases as a function of a vertical distance from the substrate 6. In one embodiment, each dielectric rail structure 42 can include a dielectric liner 42A and a dielectric rail fill portion 42B. In one embodiment, the dielectric liners 42A can include silicon nitride, and the dielectric rail fill portions 42B can include silicon oxide.

As seen from above, dielectric rail structures 42 and the rail structures (including remaining portions of the semiconductor layer stack (14T, 14C, 14B) and the sacrificial matrix layer 27) alternate along the second horizontal direction hd2 after formation of the dielectric rail structures 42.

Subsequently, a photoresist layer can be applied over the exemplary structure, and can be lithographically patterned to cover regions that overlie the global bit lines 10. In other words, openings are formed in areas between the areas of the global bit lines 10. In one embodiment, the photoresist layer can be patterned with the same pattern as the pattern of the one-dimensional array of the global bit lines 10 such that openings in the photoresist layer extend along the second horizontal direction hd2. Employing the combination of the photoresist layer and optionally the dielectric rail structures 42 as an etch mask, physically exposed portions of the rail structures (including remaining portions of the semiconductor layer stack and the sacrificial matrix layer) can be etched to form a two-dimensional array of pillar structures. Alternatively, the dielectric rail structures 42 are not used as a mask, and portions of the dielectric rail structures 42 that are not masked by the photoresist are etched together with the remaining portions of the semiconductor layer stack and the sacrificial matrix layer.

Each remaining portion of the sacrificial matrix layer constitutes a sacrificial material portion, and each remaining portion of the semiconductor layer stack constitutes a semiconductor pillar 14. Each pillar structure includes a vertical stack of a semiconductor pillar 14 and a sacrificial material portion 27. Each semiconductor pillar 14 includes a bottom active region 14B (which is a remaining portion of the first conductivity type semiconductor layer), a semiconductor channel 14C (which is a remaining portion of the channel material layer), and a top active region 14T (which is a remaining portion of the second conductivity type semiconductor layer).

Within each semiconductor pillar 14, one of the bottom active region 14B and the top active region 14T is a source region, and the other of the bottom active region 14B and the top active region 14T is a drain region. The cross-sectional shape of each semiconductor pillar 14 can be substantially invariant throughout the entirety of the semiconductor pillar 14. Further, each overlying sacrificial material portion 27 can have substantially the same horizontal cross-sectional shape as the horizontal cross-sectional shape of the underlying semiconductor pillar 14.

The photoresist layer can be removed, for example, by ashing. The two-dimensional array of cavities that separate the pillar structures along the first horizontal direction hd1 can be filled with a dielectric fill material, which can include, for example, silicon oxide, organosilicate glass, and/or silicon nitride. The dielectric fill material can be removed from above the top surfaces of the dielectric rail structures 42, for example, by chemical mechanical planarization. Each remaining portions of the dielectric fill material constitutes a dielectric fill material portion 37 located between the semiconductor pillars 14 in the hd1 direction.

Figure 3A:
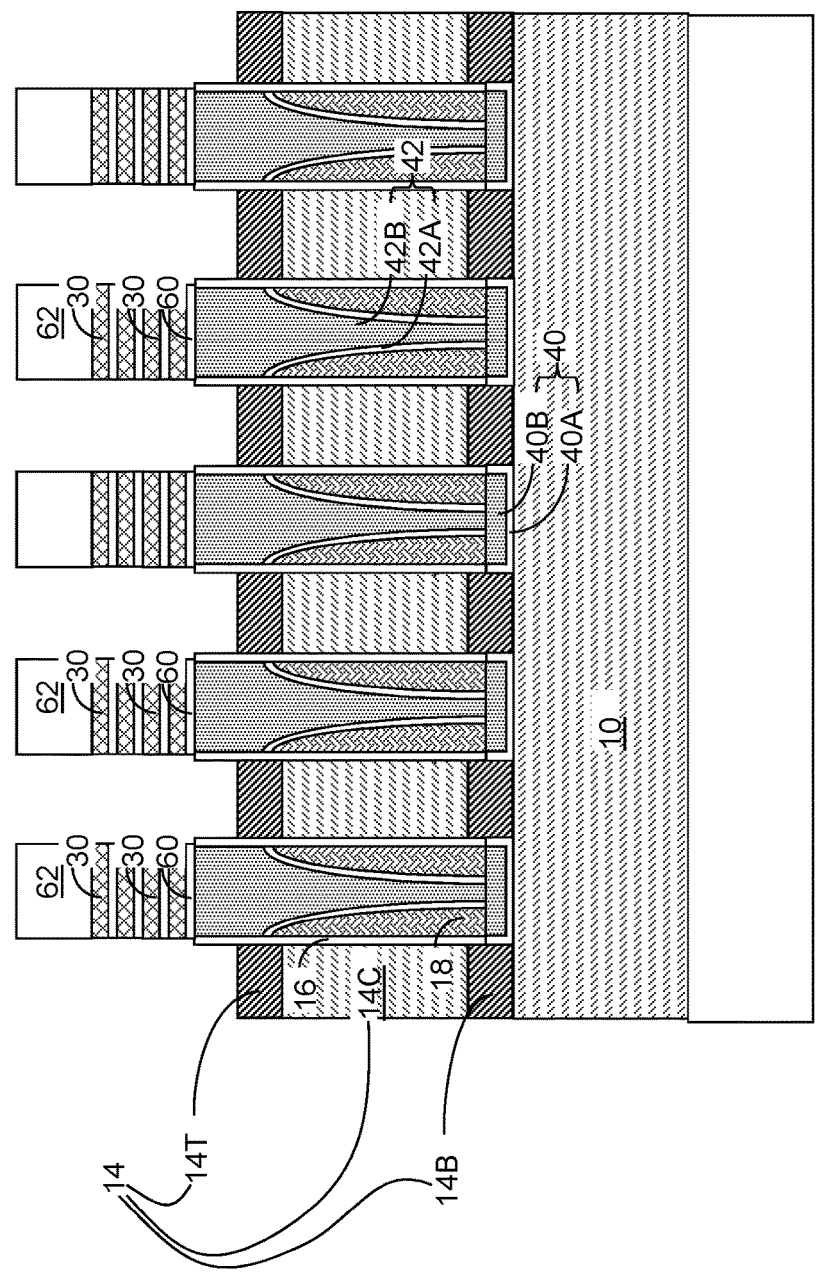
FIG. 3A is a vertical cross-sectional view of the exemplary structure after formation of alternating stacks of insulating layers and conductive material layers according to an embodiment of the present disclosure.
Figure 3B:
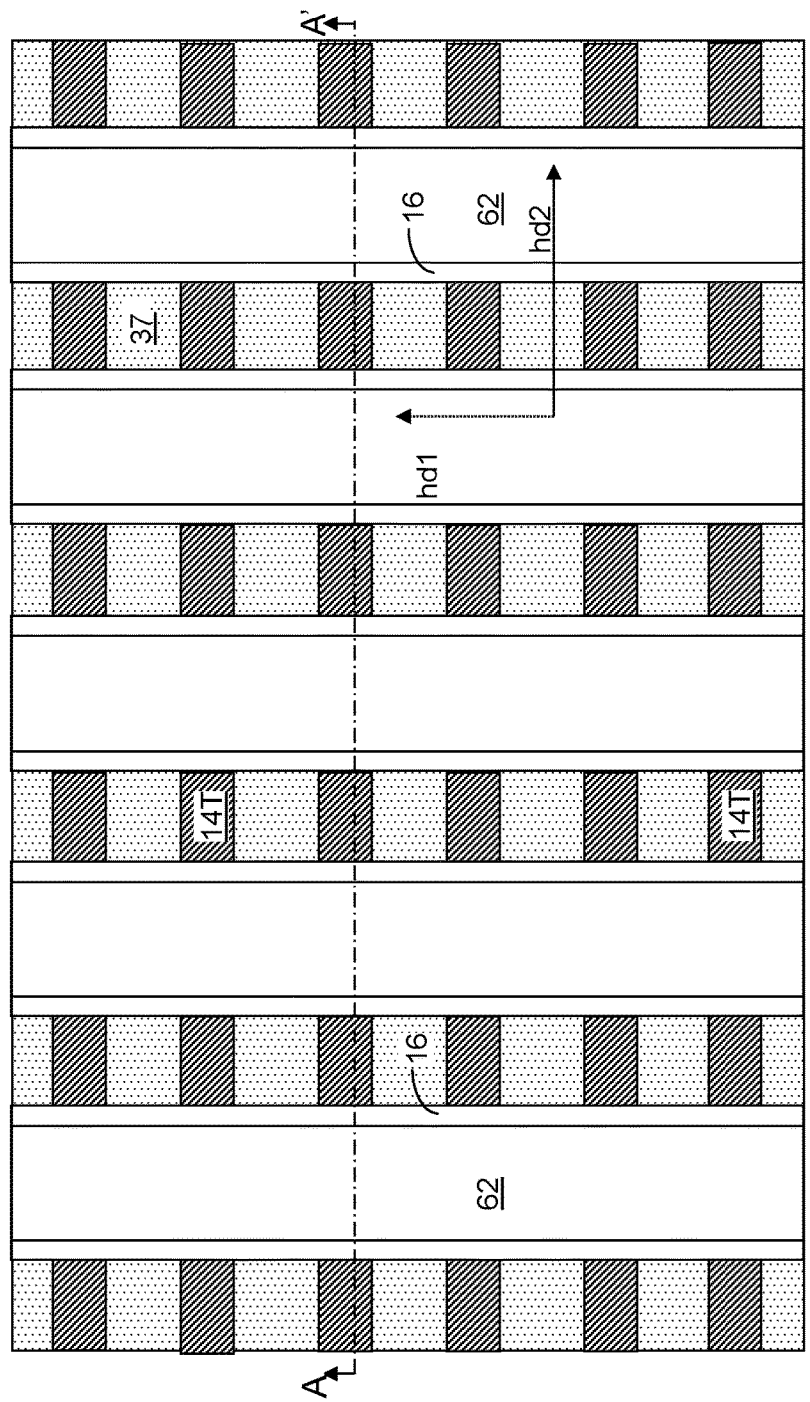
FIG. 3B is a top-down view of the exemplary structure of FIG. 3A. The vertical plane A-A' is the plane of the cross-section for FIG. 3A.

Referring to FIGS. 3A and 3B, an alternating stack of spacer material layers and insulating layers are formed over the one dimensional array of the dielectric rail structures 42 and the dielectric fill material portions as stacks of blanket (unpatterned) layers. A continuous insulating cap portion can be formed over the alternating stack of the spacer material layers and the insulating layers. In one embodiment of FIGS. 3A and 3B, the spacer material layers can be electrically conductive layers 30 that remain in a final device structure. In another embodiment, the spacer material layers can be sacrificial material layers that are subsequently replaced electrically conductive layers, as will be described in more detail below.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of the electrically conductive layers and the insulating layers may begin with an instance of the electrically conductive layers or with an instance of the insulating layers, and may terminate with an instance of the electrically conductive layers or with an instance of the insulating layers. In one embodiment, an instance of the first elements and an instance of the second elements may form a unit that is repeated with periodicity within the alternating plurality.

Subsequently, the continuous insulating cap portion and the alternating stack of the electrically conductive layers and the insulating layers are patterned to form line stack rail structures. Each line stack rail structure overlies a dielectric rail structure 42, extends along the first horizontal direction hd1, and is laterally spaced apart from one other line stack rail structures along the second horizontal direction hd2. Each patterned portion of the continuous insulating cap portion is herein referred to as an insulating cap portion 62. Each patterned portion of the electrically conductive layers is herein referred to as a conductive material layer 30 (e.g., word line). Each patterned portion of the insulating layer is herein referred to as an insulating layer. Thus, each line stack rail structure (30, 60, 62) includes an alternating stack of conductive material layers 30 and insulating layers 60 and an insulating cap portion 62. In one embodiment, each line stack rail structure (30, 60, 62) can have a lesser width along the second horizontal direction hd2 than the underlying dielectric rail structure 42, and can be entirety within the area of the underlying dielectric rail structure 42.

In one embodiment, the electrically conductive layers (i.e., the conductive material layers) 30 comprise a first electrically conductive material. In one embodiment, the first electrically conductive material can be a conductive metal nitride. In one embodiment, the first electrically conductive material can be selected from titanium nitride, tantalum nitride, titanium oxynitride in which a ratio of oxygen atoms to nitrogen atoms is less than 0.1, and tantalum oxynitride in which a ratio of oxygen atoms to nitrogen atoms is less than 0.1. Alternatively, conductive layers 30 may comprise a metal having a work function lower than 4.5 rather instead of or in addition to a metal nitride. In another embodiment, the first electrically conductive material can include a doped semiconductor material. The insulating layers 60 and the insulating cap portion 62 may comprise any suitable insulating material, such as silicon oxide.

The thickness of the conductive material layers 30 can be in a range from 5 nm to 60 nm, although lesser and greater thicknesses can also be employed. The thickness of the insulating lines 60 can be in a range from 5 nm to 60 nm, although lesser and greater thicknesses can also be employed. The thickness of the insulating cap portions 62 can be in a range from 5 nm to 300 nm, although lesser and greater thicknesses can also be employed.

A pair of a conductive material layer 30 and an insulating layer 60 can constitute a unit of repetition in the alternating stack (30, 60) of the conductive material layers 30 and the insulating layers 60. The total number of repetitions can be in a range from 8 to 1,024, although lesser and greater number of repetitions can also be employed. Thus, a plurality of alternating stacks (30, 60) of insulating layers 60 and conductive material layers 30 is formed over a substrate 6. Each of the insulating layers 60 and the conductive material layers 30 extends along the first horizontal direction (i.e., the word line direction) hd1. The alternating stacks (30, 60) are laterally spaced from one another along the second horizontal direction hd2 (i.e., the global bit line direction).

Subsequently, top regions of the sacrificial material portions 27 can be removed from above the top surfaces of the semiconductor pillars 14, for example, by an isotropic etch or an anisotropic etch. The isotropic or anisotropic etch can recess the sacrificial material portions 27 at least until the top surfaces of the semiconductor pillars 14 are physically exposed. In an illustrative example, if the sacrificial material portions 27 include organosilicate glass, a wet etch employing dilute hydrofluoric acid can be employed.

Figure 4:
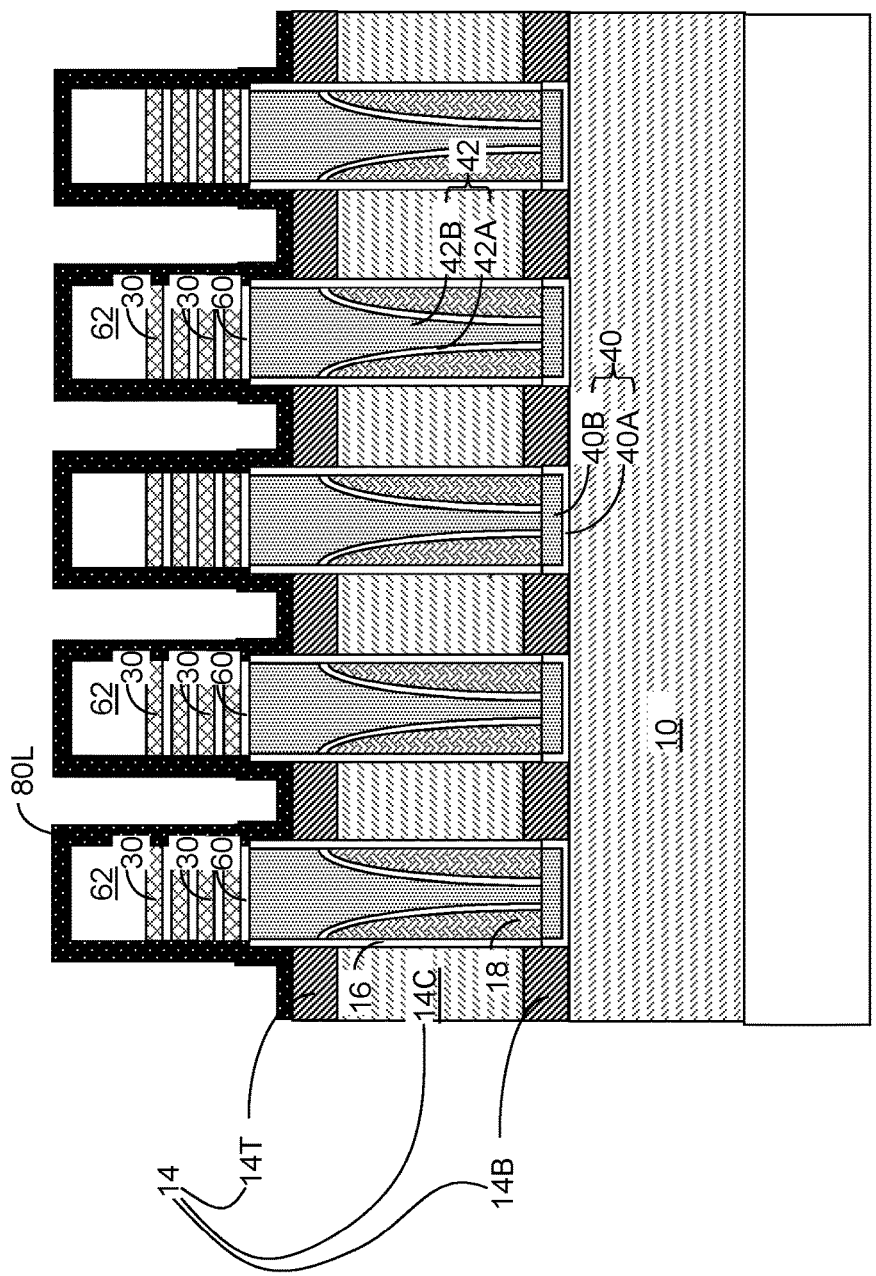
FIG. 4 is a vertical cross-sectional view of the exemplary structure after deposition of a layer stack including memory elements according to an embodiment of the present disclosure.

Referring to FIG. 4, an in-process layer stack 80L including one or multiple layers can be formed on the surfaces of the alternating stack (30, 60). The layer stack can include, from one side to another, one or more resistive memory material layers and an optional steering element layer.

As used herein, a "resistive memory material" or a "reversibly resistance-switching material" is a material whose resistivity can be altered by application of an electrical bias voltage across the material. As used herein, "resistive memory material layer" refers to a layer including a resistive memory material. As used herein, a "resistive memory element" or "resistive memory portion" refers to a portion of a resistive memory material.

The resistive memory material may be selected from: (i) a non-filamentary barrier modulated cell (BMC) which includes a barrier and an electrically conductive metal oxide whose resistivity is switched by at least one of oxygen ion and/or oxygen vacancy diffusion in response to an application of an electric field thereto, as will be described in more detail below with respect to FIGS. 8A and 8B; (ii) a phase change material portion providing at least two different levels of resistivity that depend on crystallinity; or (iii) a filamentary metal oxide portion (e.g., hafnium oxide layer) providing at least two different levels of resistivity depending on concentration of conductive filaments therein.

As used herein, a "steering element" refers to an element, such as a diode, that provides a non-linear current-voltage characteristic for electrical current passing therethrough. In one embodiment, the steering element may have an asymmetric current-voltage characteristic (e.g., a diode which conducts current primarily in one direction (asymmetric conductance) and which has a lower resistance to the flow of current in one direction, and a higher resistance in the other direction). As used herein, a "steering element layer" refers to a layer including at least one steering element.

Figure 5A:
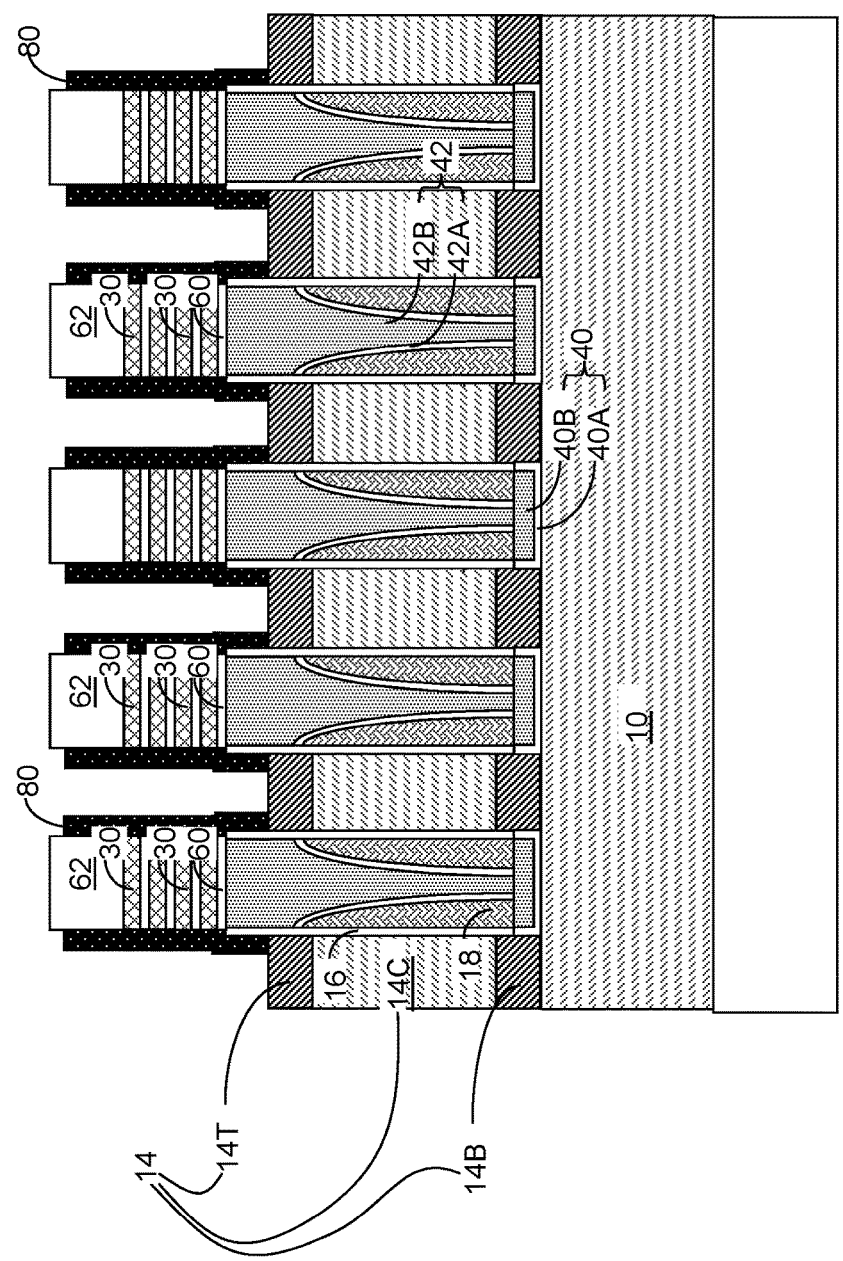
FIG. 5A is a vertical cross-sectional view of the exemplary structure after removal of horizontal portions of the layer stack according to an embodiment of the present disclosure.
Figure 5B:
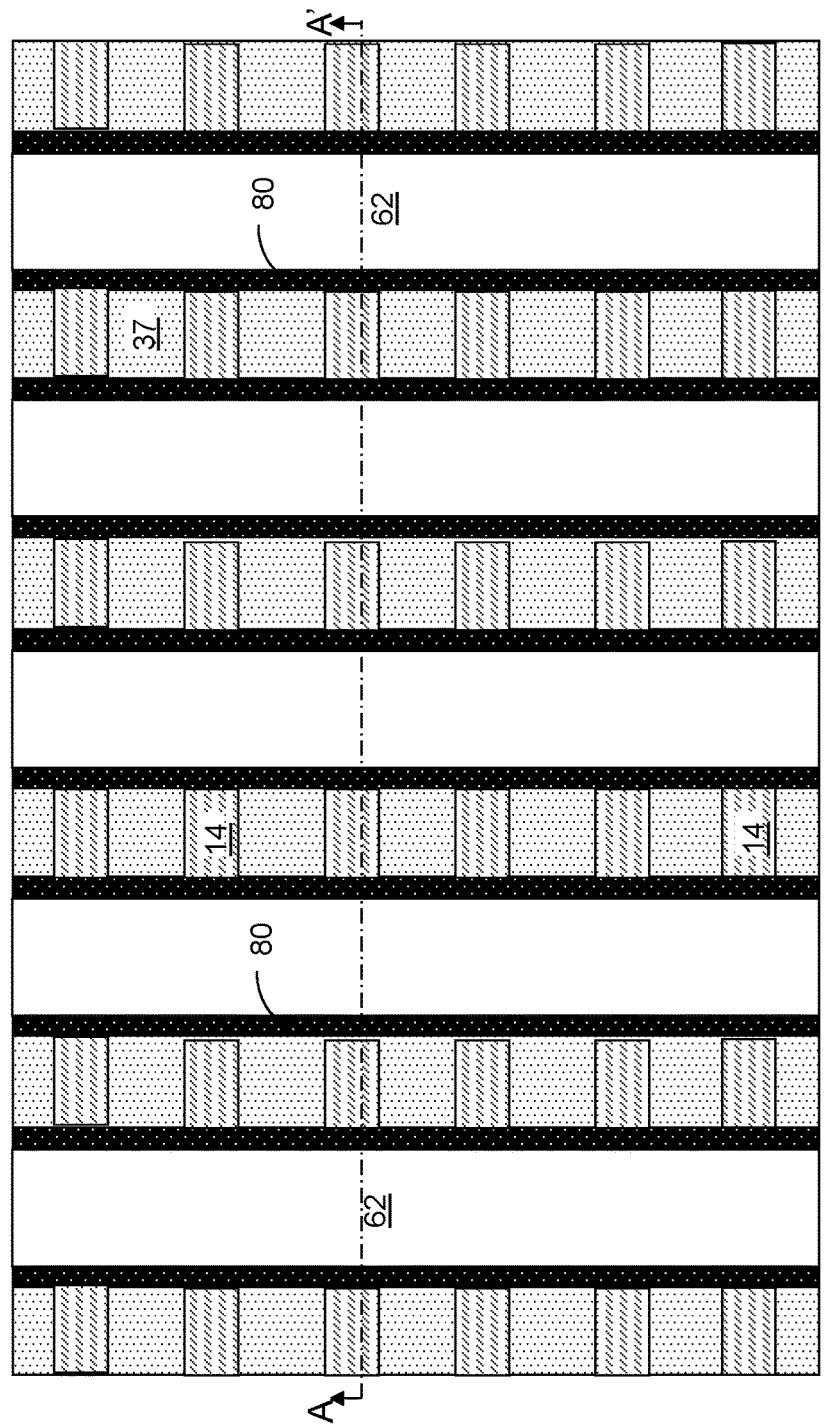
FIG. 5B is a top-down view of the exemplary structure of FIG. 5A. The vertical plane A-A' is the plane of the cross-section for FIG. 5A.

Referring to FIGS. 5A and 5B, an anisotropic etch can be performed to remove horizontal portions of the in-process layer stack 80L. Each remaining vertical portions of the in-process layer stack 80L is a layer stack 80 including the resistive memory material layer and an optional steering element layer.

In one embodiment, each second electrode can be embodied as the electrically conductive layers 30, and each first electrode can be embodied as a vertically-extending electrically conductive line to be subsequently formed on a respective layer stack 80. In another embodiment, each first electrode can be embodied as the electrically conductive layers 30, and each second electrode can be embodied as a vertically-extending electrically conductive line to be subsequently formed on a respective layer stack 80.

Figure 6A:
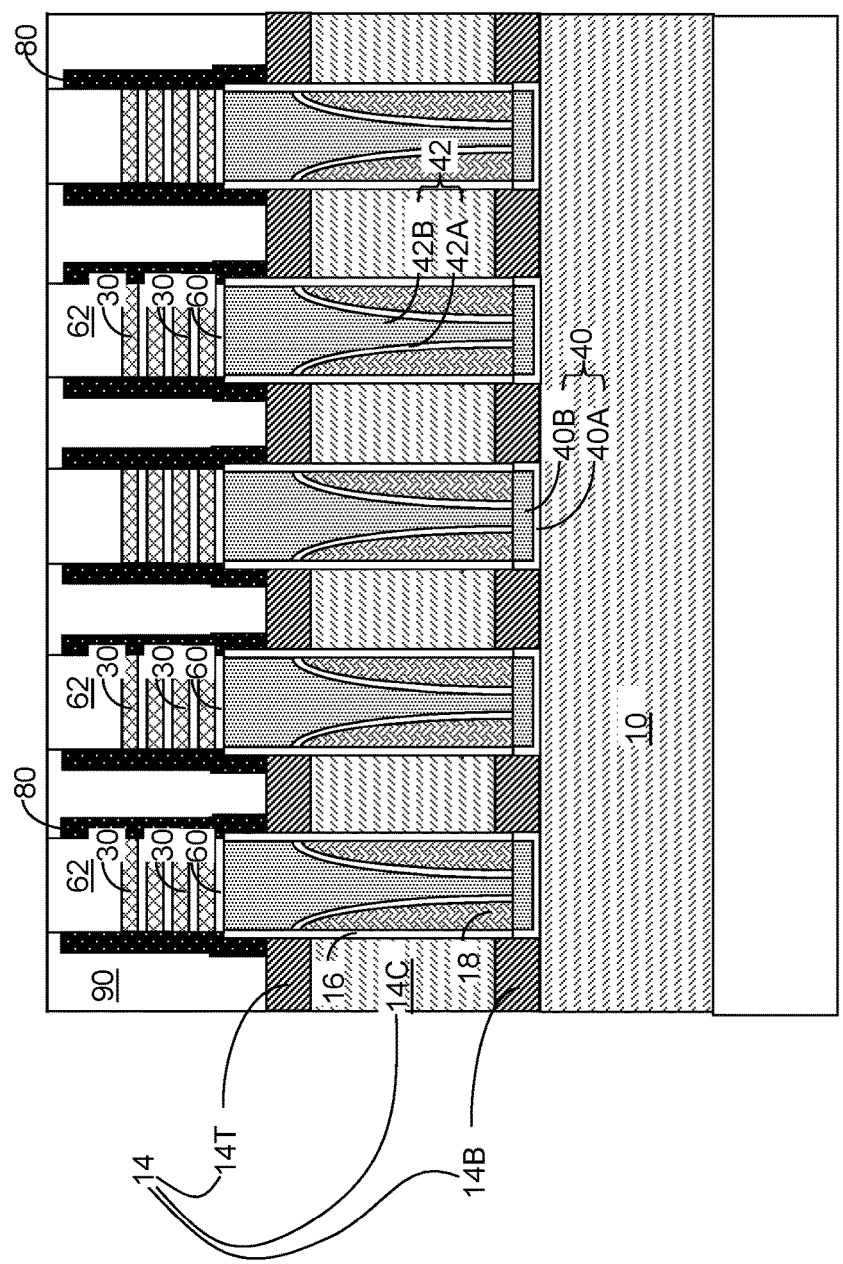
FIG. 6A is a vertical cross-sectional view of the exemplary structure after formation of electrically conductive lines and dielectric pillars according to an embodiment of the present disclosure.
Figure 6B:
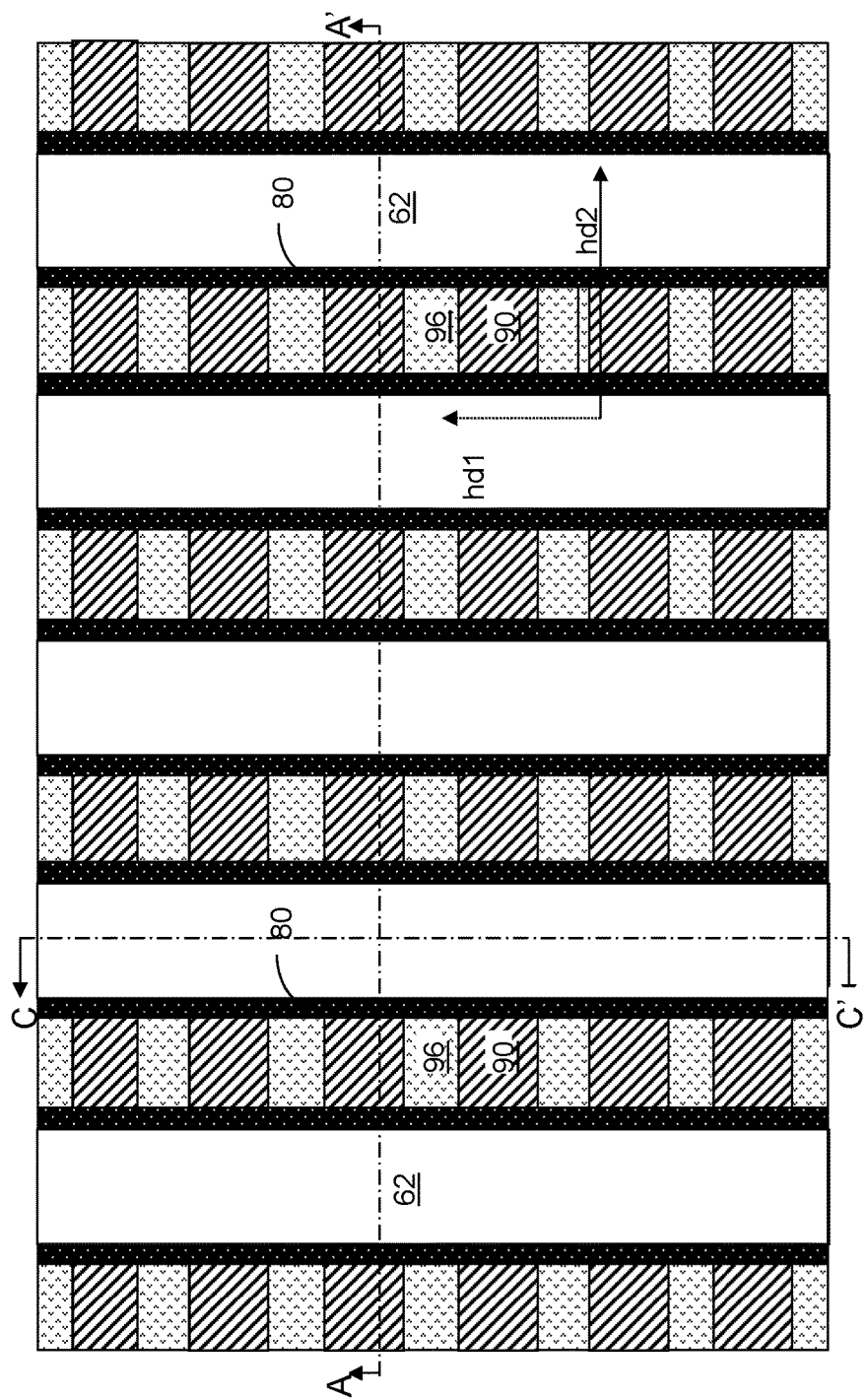
FIG. 6B is a top-down view of the exemplary structure of FIG. 6A. The vertical plane A-A' is the plane of the cross-section for FIG. 6A. The vertical plane C-C' is the plane of the cross-section for FIG. 6C.
Figure 6C:
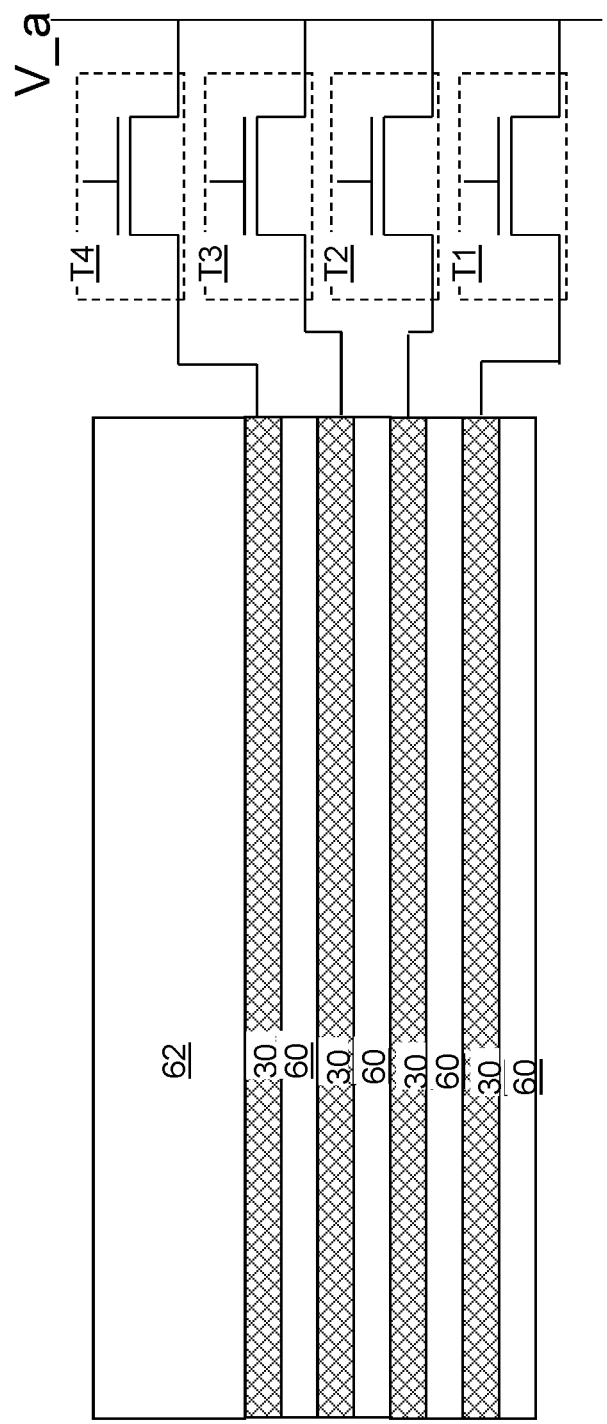
FIG. 6C is another vertical cross-sectional view of the exemplary structure of FIGS. 6A and 6B.

Referring to FIGS. 6A-6C, a laterally alternating stack of electrically conductive lines 90 and dielectric pillar structures 96 is formed within each trench located between a neighboring pair of line stack rail structures (30, 60, 62).

In one embodiment, a second electrically conductive material can be deposited within the trenches among the line stack rail structures (30, 60, 62), for example, by a conformal deposition process. The second electrically conductive material can include a conductive metallic nitride (e.g., TiN), a doped semiconductor material (e.g., polysilicon having p-type or n-type doping concentration greater than $5.0 \times 10^{19}/cm^3$), an elemental metal, and/or an intermetallic alloy (e.g., TiW) of at least two elemental metals. The second electrically conductive material can be the same as, or can be different from, the first electrically conductive material.

Excess portions of the second electrically conductive material deposited over the horizontal plane including the top surfaces of the line stack rail structures (30, 60, 62) can be removed, for example, by chemical mechanical planarization. Thus, each remaining portion of the deposited second electrically conductive material can fill a trench between a neighboring pair of line stack rail structures (30, 60, 62). Each portion of the deposited second electrically conductive material can be divided into a plurality of electrically conductive lines (e.g., local bit lines) that extend along the vertical direction, for example, by applying a photoresist layer over the top surfaces of the second electrically conductive material portions and the line stack rail structures (30, 60, 62), patterning the photoresist layer to form openings in areas that do not overlie the global bit lines 10, and removing the physically exposed portions of the second electrically conductive material employing a combination of the photoresist layer and the insulating cap portions 62 as an etch mask. Each remaining portion of the second electrically conductive material constitutes an electrically conductive line 90, which can have a shape of a pillar structure. A plurality of electrically conductive lines 90 is formed on the vertically spaced sets of layer stacks 80.

Each of the electrically conductive lines 90 can be formed over an area of a respective vertical field effect transistor (14, 16, 18), which is herein referred to as a first select transistor. Each select transistor can electrically connect a global bit line 10 to an electrically conductive line 90, or can electrically disconnect (i.e., provide an electrical open between) the global bit line 10 and the second electrically conducive line 90. A switched node of each first select transistor (i.e., a top active region 14T) is connected to an end of a respective electrically conductive line 90. Each electrically conductive line 90 can be formed as a generally pillar-shaped structure.

The electrically conductive lines 90 form a two-dimensional array having the same periodicity as the array of vertical field effect transistors (14, 16, 18) (i.e., the first access transistors). The electrically conductive lines 90 are spaced apart from one another by cavities along the first horizontal direction hd1, and by the line stack rail structures (30, 60, 62) along the second horizontal direction hd2.

A dielectric material (such as silicon oxide) can be deposited into the cavities. Excess portions of the dielectric material can be removed from above a horizontal plane including the top surfaces of the line stack rail structures (30, 60, 62) and the electrically conductive lines 90, for example, by chemical mechanical planarization. Dielectric material pillars 96 are formed in each volume of the cavities, i.e., between the electrically conductive lines 90 and between the line stack rail structures (30, 60, 62) (and therefore, between the alternating stacks (30, 60)). In this configuration, the electrically conductive lines 90 are formed as a two-dimensional array in which the electrically conductive lines 90 are spaced from one another by the dielectric material pillars 96 along the first horizontal direction hd1, and by the alternating stacks (30, 60) along the second horizontal direction hd2.

As shown in FIG. 6C, second select transistors (T1-T4) (e.g., word line select transistors) for selectively activating a respective conductive material layer 30 (i.e., word line) can be formed at any suitable stage of the processing sequence. For example, the second select transistors can be formed in, or on, the substrate 6 if the substrate 6 includes a semiconductor substrate. Alternatively or additionally, the second select transistors can be formed prior to, concurrently with, or after formation of the first select transistors (14, 16, 18). Alternatively or additionally, the second select transistors can be formed prior to, or after, formation of the electrically conductive lines 90. Any method for forming transistors as known in the art can be employed to provide the second select transistors. A switched node (e.g., a source region or a drain region) of each second select transistor can be connected to an end of a respective conductive material layer 30, and another node (e.g., a drain region or a source region) can be connected to a voltage source (or current source) which provides a node activation voltage V_a.

In one embodiment, each global bit line 10 laterally extends along the second horizontal direction hd2, and two or more of the first selector transistors (14, 16, 18) can be electrically connected to the global bit line 10. The first select transistors (14, 16, 18) are configured to activate a selected electrically conductive line 90 by supplying an activation voltage thereto from a respective global bit line 10, and the second select transistors (T1-T4) are configured to activate a selected conductive material layer 30 by supplying another activation voltage thereto. In one embodiment, the exemplary structure can include a monolithic three-dimensional memory device comprises a resistive random access memory (ReRAM) device.

FIGS. 7A-7D illustrate exemplary ReRAM devices according to the second embodiment of the present disclosure. The ReRAM devices illustrated in FIGS. 7A to 7D have the pillar/cross bar configuration.

Figure 7A:
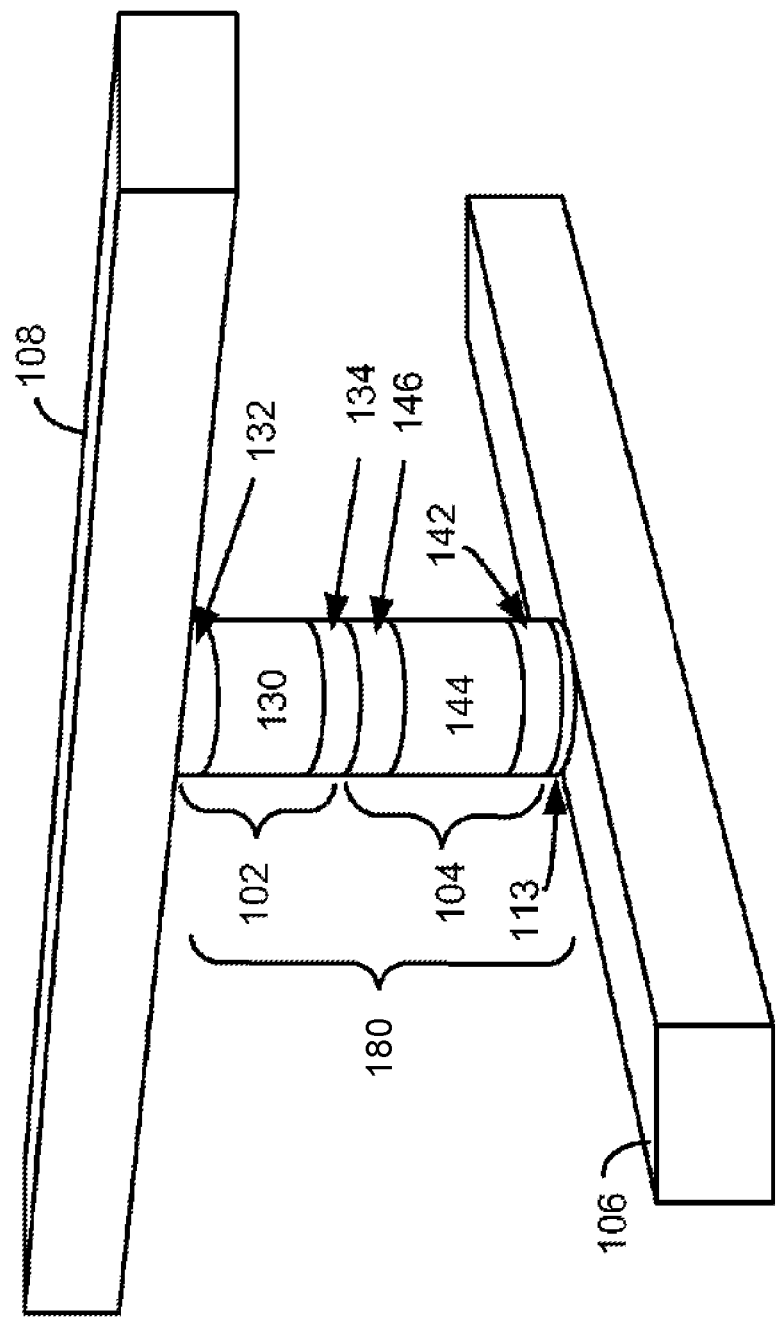
FIGS. 7A to 7D are schematic perspective views of memory devices according to another embodiment of the present disclosure.

FIG. 7A is a simplified perspective view of one configuration of the second embodiment of resistive memory cell 180 which includes a memory element 102 in series with an optional steering element 104. The memory element 102 and steering element 104 together can be in the shape of a vertical pillar.

The memory cell 180 is located between a first conductor (e.g., bit line or word line) 106 and a second conductor (e.g., word line or bit line) 108. The memory element 102 may include an optional top electrode 132, a resistance-switching material 130 and an optional bottom electrode 134. The reversibly resistance-switching material 130 may be the same as described above with respect to the first embodiment. In one embodiment, the top electrode 132 is made of titanium (Ti) or titanium nitride (TiN). The bottom electrode 134 may be made of titanium nitride (TiN), and serves as an adhesion and barrier layer.

The steering element 104 may comprise a diode comprising a heavily doped n+ polysilicon region 142, a lightly doped or an intrinsic (unintentionally doped) polysilicon region 144 above the n+ polysilicon region 142 and a heavily doped p+ polysilicon region 146 above the intrinsic region 144. An optional adhesion or barrier layer 113 may be included on top of the conductor 106.

In this manner, the memory cell may be used as part of a two- or three-dimensional memory array and data may be written to and/or read from the memory cell without affecting the state of other memory cells in the array.

In the embodiment shown, the conductors 106 and 108 are rail-shaped conductors, such as tungsten or other metal conductors, and extend in different directions (e.g., substantially perpendicular to one another). Other conductor shapes and/or configurations may be used. While the memory element 102 is shown as being positioned above the steering element 104, in alternative embodiments, the memory element 102 may be positioned below the steering element 104.

Figure 7B:
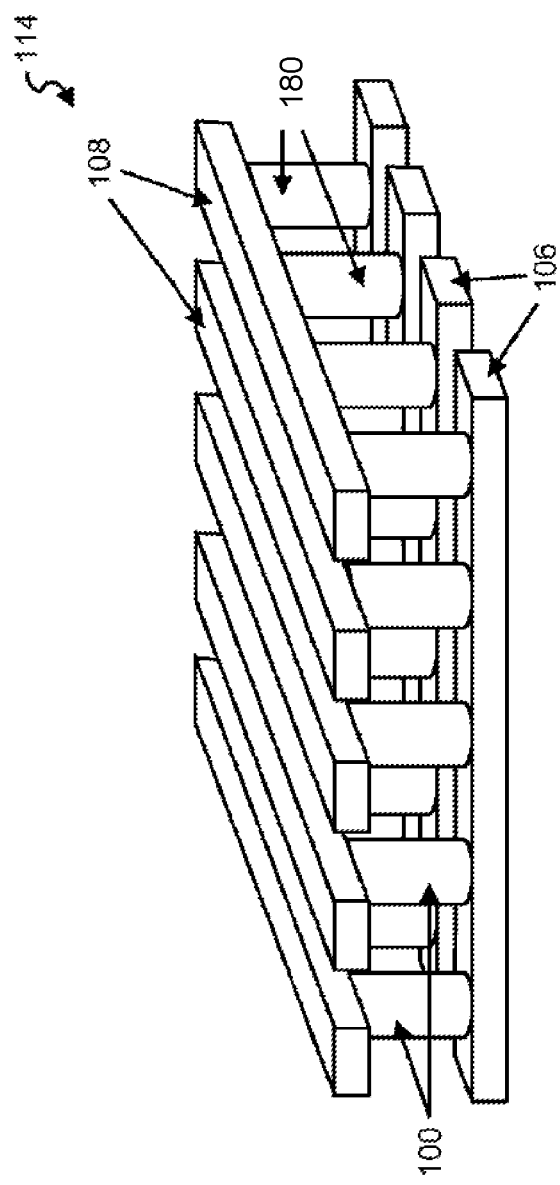

FIG. 7B is a simplified perspective view of a portion of a first memory level 114 formed from a plurality of the memory cells 180 of FIG. 7A. For simplicity, the memory element and the steering element are not separately shown. The memory array 114 is a "cross-point" or "cross bar" type array including a plurality of bit lines (second conductors 108) and word lines (first conductors 106) to which multiple memory cells are coupled as shown. Other memory array configurations may be used, as may multiple levels of memory.

Figure 7C:
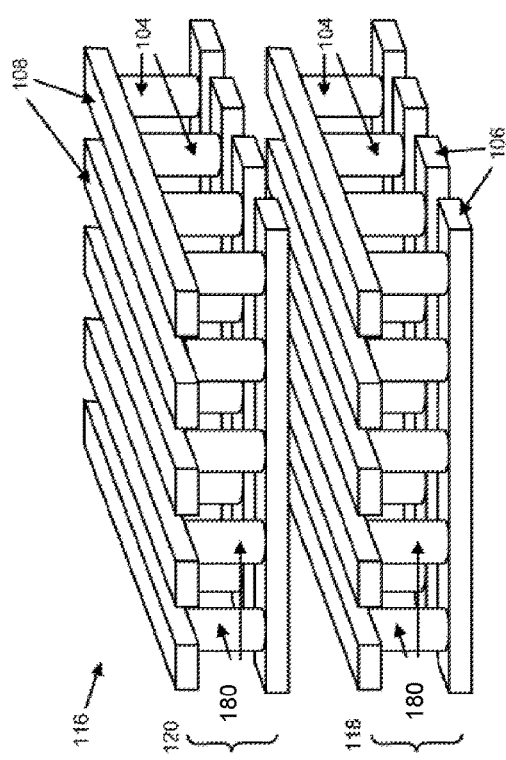

FIG. 7C is a simplified perspective view of a portion of a monolithic three-dimensional array 116 that includes a first memory level 118 positioned below a second memory level 120. Each memory level includes a plurality of memory cells 180 in a cross-point array. Additional layers (e.g., an inter-level dielectric) may be present between the first and second memory levels but are not shown for simplicity. Other memory array configurations may be used, as may additional levels of memory. In the embodiment of FIG. 7C, all diodes may "point" in the same direction, such as upward or downward depending on whether p-i-n diodes having a p-doped region on the bottom or top of the diode are employed, simplifying diode fabrication.

Figure 7D:
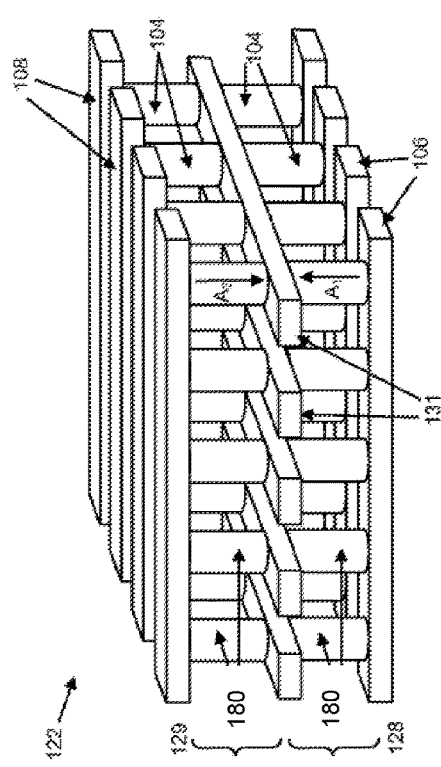

FIG. 7D is a simplified perspective view of a portion of a monolithic three-dimensional array 122 that includes a first memory level 128 positioned below a second memory level 129, where the upper conductors 131 of the first memory level are used as the lower conductors of the second memory level. In such embodiments, the diodes on adjacent memory levels can point in opposite directions. For example, the diodes of the first memory level may be upward pointing diodes as indicated by arrow A1 (e.g., with p regions at the bottom of the diodes), while the diodes of the second memory level may be downward pointing diodes as indicated by arrow A2 (e.g., with n regions at the bottom of the diodes), or vice versa.

Figure 8A:
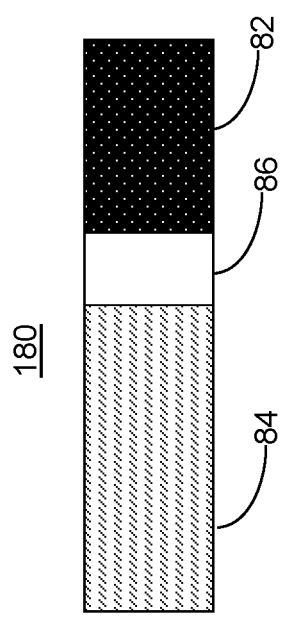
FIG. 8A is a schematic side view of a memory cell in a set state according to an embodiment of the present disclosure.
Figure 8B:
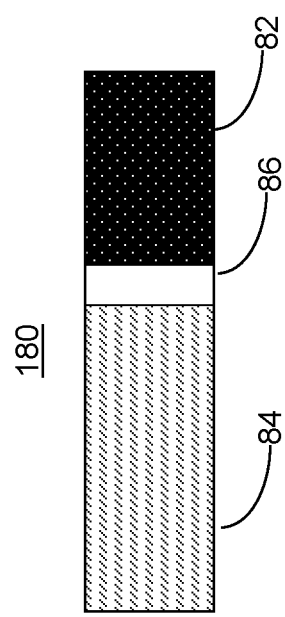
FIG. 8B is a schematic side view of a memory cell in a reset state according to an embodiment of the present disclosure.

FIGS. 8A and 8B illustrate an exemplary memory cell 180 which comprises a non-filamentary barrier modulated cell (BMC). The BMC may be used in the VBL type ReRAM shown in FIGS. 2A-6C or in the pillar/cross bar type ReRAM shown in FIGS. 7A-7D or in any other suitable ReRAM configuration.

In one embodiment, each memory cell can include a metal oxide material 82 having at least two resistive states having different resistivity. Examples of metal oxide materials 82 include a slightly sub-stoichiometric metal oxide such as $TiO_{2-\delta}$, $SrTiO_{3-\delta}$, $NbO_{2-\delta}$, or $Nb:SrTiO_{3-\delta}$ where value of $\delta$ can be independently selected from a range from 0 to 0.5, such as greater than zero to 0.15 (i.e., to form a sub-stoichiometric, oxygen deficient metal oxide). For example, the metal oxide material 82 may be titanium oxide, such as sub-stoichiometric titanium oxide having less than two oxygen atoms for each titanium atom. In one embodiment, the metal oxide may have a high concentration of free electrons in thermodynamic equilibrium in a range from $1.0 \times 10^{20}/cm^3$ to $1.0 \times 10^{21}/cm^3$.

The memory cell may also include a barrier material 84, such as amorphous silicon or other suitable barrier materials. An interfacial barrier oxide 86 is located between the metal oxide material 82 and the barrier material 84. For an amorphous silicon barrier material 84, the interfacial barrier oxide 86 may comprise silicon oxide. The thickness of the metal oxide material 82 and the barrier material 84 can be in a range from 5 nm to 30 nm, such as from 9 nm to 15 nm, although lesser and greater thicknesses can also be employed.

Without wishing to be bound by a particular theory, it is believed that the BMC ReRAM device operates based on the principle shown in FIGS. 8A and 8B. FIG. 8A illustrates the BMC ReRAM device in the reset state. The switching mechanism in BMC stack is generally understood as oxygen interstitial (Oi) generation in the interfacial barrier oxide (e.g., $SiO_2$) 86 at the amorphous silicon (a-Si) 84/$TiO_{2-\delta}$ 82 interface after a RESET operation (i.e., resetting the stack into the high resistivity state, HRS). The oxygen interstitials may drift into defect rich $TiO_{2-\delta}$ where they cause a re-oxidation of the $TiO_{2-\delta}$ (e.g., recombine with oxygen vacancies in the $TiO_{2-\delta}$ near the interface. This re-oxidation decreases the conductivity of the $TiO_{2-\delta}$ material and/or increases the thickness of the insulating interfacial barrier oxide 86 and hence increases the resistance of the BMC memory cell.

FIG. 8B illustrates the BMC ReRAM device in the set state. During the SET operation, opposite voltage is applied across the cell, and Ti—O bonds are supposed to be broken down to generate Oi and Vo (oxygen vacancy) pair in the titanium oxide layer 82. Oi may drift back to the a-Si 84/$TiO_{2-\delta}$ 82 interface along the electric field to increase the conductivity of the $TiO_{2-\delta}$ layer and/or decrease the thickness of the insulating interfacial barrier oxide 86 and hence decrease the resistance of the BMC memory cell to set the memory cell into the low resistivity state, LRS.

Without wishing to be bound by a particular theory, it is believed that a BMC ReRAM device of the embodiments of the present disclosure may operate based on the principle described above with respect to FIGS. 8A and 8B and/or based on an alternative principle instead of or in addition to the principle described above. For example, the BMC ReRAM device may operate by modulation of energy band structure within the cell. When the charge carrier density is modulated, the resistance of the cell is changed. In other words, the resistance of the memory cell may be modulated by changes in the band structure and consequent changes in the charge distribution instead of or in addition to the change in thickness of the interfacial barrier oxide 86.

According to an aspect of the present disclosure, a method of operating a resistive memory device allows re-examination of resistive memory cells providing intermediate measured electrical current under the read bias condition. The re-examination process examines the threshold voltage of each resistive memory cell that provides an intermediate measured electrical current under the read bias condition, and determines whether each resistive memory cell exhibits a threshold voltage that is within a respective target range.

In one embodiment, the target range of the threshold voltage for the set state and the target range of the threshold voltage for the reset state are programmed into a write verification program controller, which compares the measured threshold voltages with a respective target range for the threshold voltage, and determines whether each resistive memory cell is functional or not. Thus, a higher fraction of the resistive memory cells can be utilized during operation of the resistive memory device.

Figure 9:
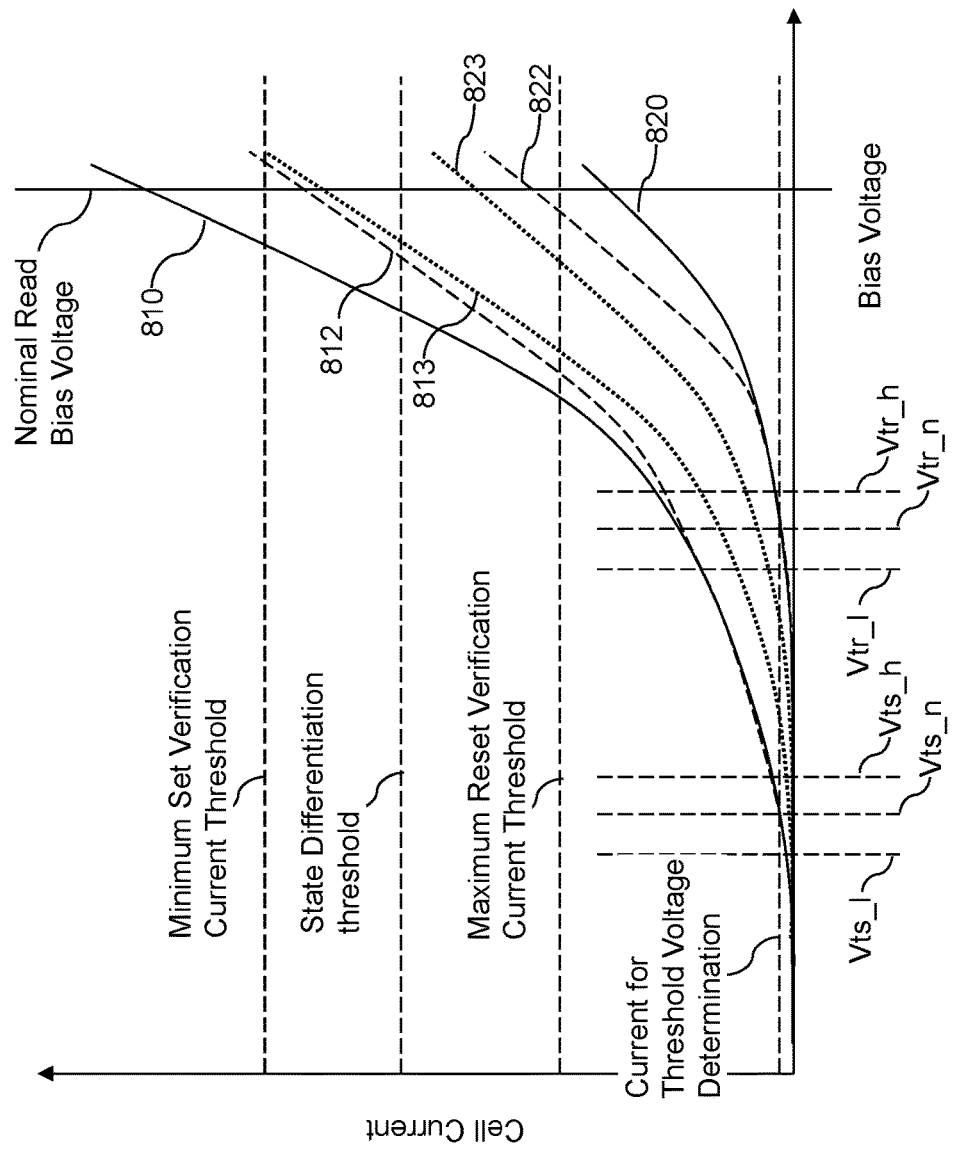
FIG. 9 illustrates various I-V curves for a serial connection of a selected resistive memory device and an access transistor connected thereto.

Referring to FIG. 9, current-voltage curves for a serial connection of a selected resistive memory cell 180 and an access transistor connected thereto are illustrated for various exemplary states of the selected resistive memory cell 180. The "selected" resistive memory cell 180 refers to a resistive memory cell that is uniquely accessed by a combination of various electrodes (e.g., bit lines and word lines). The selected resistive memory cell 180 is connected to an access transistor in a series connection. For example, the source node or the drain node may be electrically shorted to a first electrode or the second electrode of the selected resistive memory cell 180. The access transistor, which may be, for example, a vertical field effect transistor in the exemplary structure of FIGS. 6A and 6B.

During a normal sensing mode, the resistive state of the selected resistive memory cell 180 is determined by a sense transistor that senses a high resistance state (i.e., a reset state) or a low resistance state (i.e., a set state) depending on the measured current through the series connection of the selected resistive memory cell 180 and the access transistor under a preselected sense voltage, which is herein referred as a nominal read bias voltage.

For example, if the measured electrical current (i.e., cell current) is greater than the state differentiation threshold current, the state of the selected resistive memory cell 180 is deemed to be in a low resistive state. If the measured electrical current is less than the state differentiation threshold, the state of the selected resistive memory cell 180 is deemed to be in a high resistive state.

The sense amplifier circuitry can operate in a different mode during a write verification operation. The write verification operation (called a "read current verification test" herein) is performed after a write operation that writes data to a set of resistive memory cells 180. The resistive states of the set of resistive memory cells 180 into which data is written are checked to determine if the data has been correctly written. Thus, the resistive state of each resistive memory cell 180 among the set of resistive memory cells 180 is compared with the original data stored in the buffer memory.

In order to ensure that the resistive state of each resistive memory cell 180 provides a high enough resistance (for a reset state) or a low enough resistance (for a set state) having a sufficient sense margin relative to the state differentiation threshold, different current thresholds are employed for the write verification operation than the state differentiation threshold for normal sensing operation.

Specifically, a minimum set verification current threshold that is higher than the state differentiation threshold can be employed as a reference for verifying that a selected resistive memory cell 180 is programmed into a low resistance state with sufficient current margin in the cell current at the nominal read bias voltage. The minimum set verification current threshold is the minimum current for verifying a set state of a selected resistive memory cell 180. Measurement of a current that exceeds the minimum set verification current threshold is deemed as an indication that the selected resistive memory cell has a low enough resistance, and therefore, the set state of the selected resistive memory cell 180 can be verified.

Likewise, a maximum reset verification current threshold that is lower than the state differentiation threshold can be employed as a reference for verifying that a selected resistive memory cell 180 is programmed into a high resistance state with sufficient current margin in the cell current at the nominal read bias voltage. The maximum set verification current threshold is the maximum current for verifying a reset state of a selected resistive memory cell 180. Measurement of a current that is less than the maximum reset verification current threshold is deemed as an indication that the selected resistive memory cell has a high enough resistance, and therefore, the reset state of the selected resistive memory cell 180 can be verified.

A simple read current verification test scheme that employs the minimum set verification current threshold and the maximum reset verification current threshold may be employed to determine whether each resistive memory cell in the set of resistive memory cells 180 is programmed with sufficient current margin at the nominal read bias voltage, and therefore whether the cell is functional or not.

However, such a simple scheme has a tendency of generating a significant number of "fails" (i.e., "bad" or "non-operational" resistive memory cells) which include resistive memory cells that produce a cell current at the nominal read bias voltage that is close to a respective verification current threshold, but does not meet the criterion (i.e., either exceed the minimum set verification threshold for a set state, or be less than the maximum reset verification threshold for a reset state). According to aspect of the present disclosure, each resistive memory cell 180 that initially fails the read current verification test criterion for determining functionality of a resistive memory cell 180 is subjected to further analysis to determine whether the resistive memory cell 180 can be reliably used as a functional cell under a normal sensing operation that employs the state differentiation threshold.

In an illustrative example, FIG. 9 shows three exemplary set state current-voltage (IV) curves. The first exemplary set state I-V curve 810 corresponds to a resistive memory cell 180 that is programmed into a set state with sufficiently low resistance such that the cell current at the nominal read bias voltage exceeds the minimum set verification current threshold. Thus, the resistive memory cell 180 corresponding to the first exemplary set state I-V curve 810 is verified as a functional resistive memory cell during a write verification process (e.g., pass the read current verification test).

The second exemplary set state I-V curve 812 corresponds to a resistive memory cell 180 that is programmed into a set state with insufficiently low resistance such that the cell current at the nominal read bias voltage does not exceed the minimum set verification current threshold. The write verification process identifies the resistive memory cell 180 corresponding to the second exemplary set state I-V curve 812 as not meeting the current specification for a set state (e.g., fails the read current verification test).

According to an aspect of the present disclosure, the I-V characteristics of the circuit including the resistive memory cell 180 and an access transistor connected thereto and providing the second exemplary set state I-V curve 812 is further analyzed. Specifically, prior to the write operation or the write verification operation, the nominal threshold voltage for the set state $Vts\_n$, the minimum threshold voltage for the set state $Vts\_1$, and the maximum threshold voltage for the set state $Vts\_h$ are determined based on samples of the functional resistive memory cells 180 that reliably provide cell current greater than the state differentiation threshold during normal sensing operations. In other words, the minimum threshold voltage for the set state $Vts\_1$ and the maximum threshold voltage for the set state $Vts\_h$ are selected such that each functional combination of a resistive memory cell 180 and an access transistor that has a threshold voltage between the minimum threshold voltage for the set state $Vts\_1$ and the maximum threshold voltage for the set state $Vts\_h$ reliably provides cell current greater than the state differentiation threshold during normal sensing operations. The I-V characteristics of the second exemplary set state I-V curve 812 are examined by the threshold voltage extraction circuitry within the bias voltage range between the minimum threshold voltage for the set state $Vts\_1$ and the maximum threshold voltage for the set state $Vts\_h$. In other words, the threshold voltage extraction circuitry determines if the second exemplary set state I-V curve 812 has a threshold voltage within the bias voltage range between the minimum threshold voltage for the set state $Vts\_1$ and the maximum threshold voltage for the set state $Vts\_h$.

As used herein, a "threshold voltage" refers to a voltage at which an I-V curve has a predefined level of electrical current that provides a marginally turned-on state. The pre-defined level of electrical current can be typically in a range from $1.0\times10^{-6}$ times the state differentiation threshold current to $1.0\times10^{-2}$ times the state differentiation threshold current, although lesser and greater current levels can also be employed. For example, for a circuit including having 10 micro Amps as the state differentiation threshold current, the threshold voltage can refer to the voltage at which the electrical current is at 10 nA. In a non-limiting illustrative example, if the nominal read bias voltage is about 2 V, the minimum threshold voltage for the set state $Vts\_1$ may be about 0.1 V, and the maximum threshold voltage for the set state $Vts\_h$ may be about 0.3V. It is understood that the nominal read bias voltage, the minimum threshold voltage for the set state $Vts\_1$, and the maximum threshold voltage for the set state $Vts\_h$ can be scaled with device dimensions, and therefore, may be vary depending on device design.

In the case of the second exemplary set state I-V curve 812, the threshold voltage is between the minimum threshold voltage for the set state $Vts\_1$ and the maximum threshold voltage for the set state $Vts\_h$. Once the threshold voltage extraction circuitry determines that the second exemplary set state I-V curve 812 has a threshold voltage within the range between the minimum threshold voltage for the set state Vts_1 and the maximum threshold voltage for the set state Vts_h, the write verification program controller determines that the corresponding resistive memory cell 180 is a functional resistive memory cell 180. Optionally, the state differentiation threshold for normal sensing operation may be employed to verify that the second exemplary set state I-V curve 812 provides cell current that exceeds the state differentiation threshold at the nominal read bias voltage. By identifying the resistive memory cell 180 that provides the second exemplary set state I-V curve 812 as a functional resistive memory cell 180, the methods of the present disclosure can increase the number of available functional resistive memory cells 180.

The third exemplary set state I-V curve 813 corresponds to a resistive memory cell 180 that is programmed into a set state with insufficiently low resistance such that the cell current at the nominal read bias voltage does not exceed the minimum set verification current threshold (e.g., fails the read current verification test). The write verification process identifies the resistive memory cell 180 corresponding to the third exemplary set state I-V curve 813 as a resistive memory cell 180 not meeting the current specification for the set state. The same analysis can be performed on the resistive memory cell 180 providing the third exemplary set state I-V curve 813 as on the resistive memory cell 180 providing the second exemplary set state I-V curve 812.

Specifically, the I-V characteristics of the third exemplary set state I-V curve 813 are examined by the threshold voltage extraction circuitry within the bias voltage range between the minimum threshold voltage for the set state Vts_1 and the maximum threshold voltage for the set state Vts_h. In the case of the third exemplary set state I-V curve 813, the threshold voltage is greater than maximum threshold voltage for the set state Vts_h, and thus, is outside the range of the minimum threshold voltage for the set state Vts_1 and the maximum threshold voltage for the set state Vts_h. Once the threshold voltage extraction circuitry determines that the second exemplary set state I-V curve 812 has a threshold voltage outside the range between the minimum threshold voltage for the set state Vts_1 and the maximum threshold voltage for the set state Vts_h, the write verification program controller identifies the corresponding resistive memory cell 180 as a non-functional (e.g., "bad") resistive memory cell 180. The data rerouting register 540 can be activated to mark the corresponding resistive memory cell 180 as a non-functional resistive memory cell, and to re-route the data to a functional resistive memory cell 180 (which may be a redundancy resistive memory cell that is provided within the memory array 550 of FIG. 1 or within a different memory array).

By analyzing the threshold voltage for the resistive memory cells 180 that fail the initial read current verification test employing the minimum set verification current threshold, the method of the present disclosure can identify a fraction of such resistive memory cells 180 as functional resistive memory cells 180, and increase the number of available functional resistive memory cells.

Additionally, FIG. 9 shows three exemplary reset state current-voltage (IV) curves. The first exemplary reset state I-V curve 820 corresponds to a resistive memory cell 180 that is programmed into a reset state with sufficiently high resistance such that the cell current at the nominal read bias voltage is less than the maximum reset verification current threshold. Thus, the resistive memory cell 180 corresponding to the first exemplary reset state I-V curve 820 is verified as a functional resistive memory cell during a write verification process (e.g., passes the read current verification test).

The second exemplary reset state I-V curve 822 corresponds to a resistive memory cell 180 that is programmed into a reset state with insufficiently high resistance such that the cell current at the nominal read bias voltage exceeds the maximum reset verification current threshold. The write verification process identifies the resistive memory cell 180 corresponding to the second exemplary reset state I-V curve 822 as not meeting the current specification for a reset state (e.g., fails the read current verification test).

According to an aspect of the present disclosure, the I-V characteristics of the circuit including the resistive memory cell 180 and an access transistor connected thereto and providing the second exemplary reset state I-V curve 822 is further analyzed. Specifically, prior to the write operation or the write verification operation, the nominal threshold voltage for the reset state Vtr_n, the minimum threshold voltage for the reset state Vtr_1, and the maximum threshold voltage for the reset state Vtr_h are determined based on samples of the functional resistive memory cells 180 that reliably provide cell current less than the state differentiation threshold during normal sensing operations. In other words, the minimum threshold voltage for the reset state Vtr_1 and the maximum threshold voltage for the reset state Vtr_h are selected such that each functional combination of a resistive memory cell 180 and an access transistor having a threshold voltage between the minimum threshold voltage for the reset state Vtr_1 and the maximum threshold voltage for the reset state Vtr_h reliably provides cell current less than the state differentiation threshold during normal sensing operations. The I-V characteristics of the second exemplary reset state I-V curve 822 are examined by the threshold voltage extraction circuitry within the bias voltage range between the minimum threshold voltage for the reset state Vtr_1 and the maximum threshold voltage for the reset state Vtr_h. In other words, the threshold voltage extraction circuitry determines if the second exemplary reset state I-V curve 822 has a threshold voltage within the bias voltage range between the minimum threshold voltage for the reset state Vtr_1 and the maximum threshold voltage for the reset state Vtr_h.

In the case of the second exemplary reset state I-V curve 822, the threshold voltage is between the minimum threshold voltage for the reset state Vtr_1 and the maximum threshold voltage for the reset state Vtr_h. Once the threshold voltage extraction circuitry determines that the second exemplary reset state I-V curve 822 has a threshold voltage within the range between the minimum threshold voltage for the reset state Vtr_1 and the maximum threshold voltage for the reset state Vtr_h, the write verification program controller determines that the corresponding resistive memory cell 180 is a functional resistive memory cell 180. Optionally, the state differentiation threshold for normal sensing operation may be employed to verify that the second exemplary reset state I-V curve 822 provides cell current that is less than the state differentiation threshold at the nominal read bias voltage. By identifying the resistive memory cell 180 that provides the second exemplary reset state I-V curve 822 as a functional resistive memory cell 180, the methods of the present disclosure can increase the number of available functional resistive memory cells 180.

The third exemplary reset state I-V curve 823 corresponds to a resistive memory cell 180 that is programmed into a reset state with insufficiently high resistance such that the cell current at the nominal read bias voltage is greater than the maximum reset verification current threshold. The write verification process identifies the resistive memory cell 180 corresponding to the third exemplary reset state I-V curve 823 as a resistive memory cell 180 that does not meet the current specification for the reset state (e.g., fails the read current verification test). The same analysis can be performed on the resistive memory cell 180 providing the third exemplary reset state I-V curve 823 as on the resistive memory cell 180 providing the second exemplary reset state I-V curve 822.

Specifically, the I-V characteristics of the third exemplary reset state I-V curve 823 are examined by the threshold voltage extraction circuitry within the bias voltage range between the minimum threshold voltage for the reset state Vtr_1 and the maximum threshold voltage for the reset state Vtr_h. In the case of the third exemplary reset state I-V curve 823, the threshold voltage is less than minimum threshold voltage for the reset state Vtr_1, and thus, is outside the range of the minimum threshold voltage for the reset state Vtr_1 and the maximum threshold voltage for the reset state Vtr_h. Once the threshold voltage extraction circuitry determines that the second exemplary reset state I-V curve 822 has a threshold voltage outside the range between the minimum threshold voltage for the reset state Vts_1 and the maximum threshold voltage for the reset state Vts_h, the write verification program controller identifies the corresponding resistive memory cell 180 as a non-functional resistive memory cell 180. The data rerouting register 540 can be activated to mark the corresponding resistive memory cell 180 as a non-functional resistive memory cell, and to re-route the data to be a functional resistive memory cell 180 (which may be a redundancy resistive memory cell that is provided within the memory array 550 of FIG. 1 or within a different memory array).

By analyzing the threshold voltage for the resistive memory cells 180 that fail the initial read current verification test employing the maximum reset verification current threshold, the method of the present disclosure can identify a fraction of such resistive memory cells 180 as functional resistive memory cells 180, and increase the number of available functional resistive memory cells.

Figure 10:
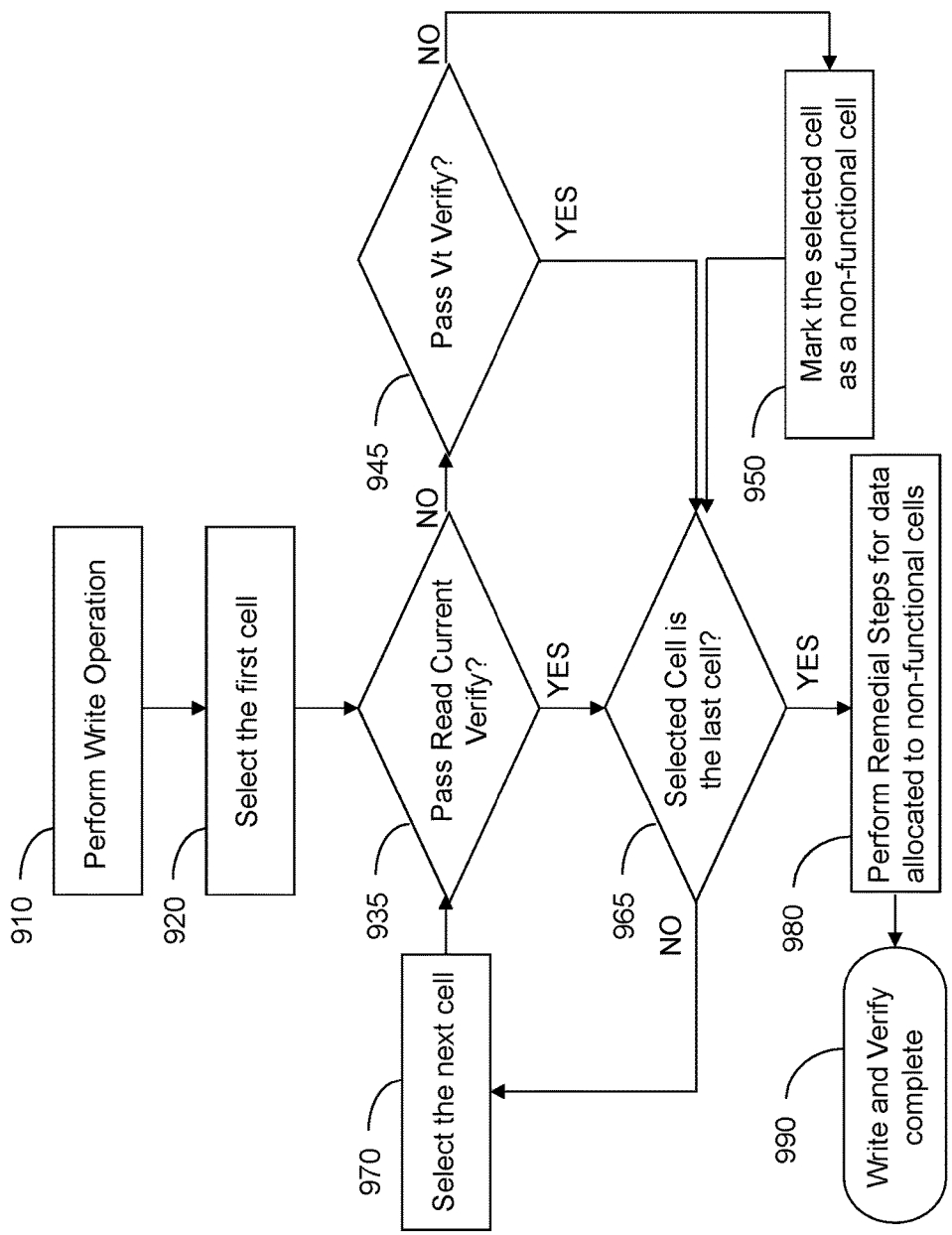
FIG. 10 is a flow diagram for determining whether resistive memory cells into which data is written are operational resistive memory cells.

According to an aspect of the present disclosure, a write operation and a write verification operation can be performed on the resistive memory device of the present disclosure illustrated in FIG. 1 employing a set of processing steps illustrated in FIG. 10.

Referring to step 910, a write operation can be performed on a set of resistive memory cells 180, which may correspond to a page in the resistive memory device. During the write operation, each resistive memory cell 180 within the set of resistive memory cells 180 can be programmed into a respective selected resistive state, which may be a high resistance state (a reset state) or a low resistance state (a set state). The programming of the resistive memory cells 180 may be performed sequentially.

Subsequently, the resistive state of each programmed resistive memory cell 180 can be sequentially verified to perform a write verification operation. Referring to step 920, the first resistive memory cell 180 among the programmed (written) set of resistive memory cells 180 can be selected for verification of the resistive state.

Referring to step 935, the sense amplifier circuitry measures the electrical current through the selected resistive memory cell 180 at a preset read voltage to determine whether the measured electrical current is with the electrical current specification for the selected resistive state of the selected resistive memory cell 180. For example, if the selected resistive memory cell 180 was programmed into a set state during the writing process, the selected resistive state is the set state (low resistance state). If the preset read voltage is the same as the read voltage of the sense amplifier circuitry for a normal read operation that determines the resistive state of the resistive memory cells (i.e., the normal read bias voltage), the electrical current specification for the set state is greater than the minimum set verification current threshold, and the electrical current specification for the reset state is less than the maximum reset verification current threshold. The step of determining whether the selected resistive memory cell 180 meets the current specification at the preset read voltage for the selected resistive state is herein referred to as a read current verification test. Generally, there is a finite gap (in electrical current) between the minimum set verification current threshold and the maximum reset verification current threshold so as to provide sufficient read current margin between the two resistive states. The write verification program controller can determine if the selected resistive memory cell passes the read current verification test.

If the selected resistive memory cell passes the read current verification test, the selected resistive memory cell 180 is identified as an operational (i.e., functional) resistive memory cell, and the process flow proceeds to step 965. If the measured electrical current at the preset read voltage is out of specification, the selected resistive memory cell 180 fails the read current verification test. In this case, the process flow proceeds to step 945.

Step 945 is performed only if the selected resistive memory cell fails the read current verification test. At step 945, the write verification program controller determines whether a measured threshold voltage for the selected resistive memory cell 180 is within threshold voltage specification for the selected resistive state. This determination is herein referred to as a threshold voltage test. The threshold voltage for the selected resistive memory cell 180 can be measured, for example, employing the methods illustrated in FIG. 9. Specifically, the threshold voltage for the selected resistive memory cell 180 can be generated by measurement, in which the electrical bias voltage across the selected resistive memory cell 180 that provides a preset level of electrical current through the selected resistive memory cell. The preset level of electrical current is the electrical current that corresponds to the threshold voltage. For example, the preset level of electrical current can be the current for threshold voltage determination as illustrated in FIG. 9.

In one embodiment, the pre-defined level of electrical current can be typically in a range from $1.0 \times 10^{-6}$ times the state differentiation threshold current to $1.0 \times 10^{-2}$ times the state differentiation threshold current, although lesser and greater current levels can also be employed. For example, for a circuit including having 10 micro Amps as the state differentiation threshold current, the threshold voltage can refer to the voltage at which the electrical current is at 10 nA. The preset level of electrical current can be less than 0.01 times the maximum reset verification current threshold for a high resistive state for each of the resistive memory cells 180 within the array of resistive memory cells 180.

If the measured threshold voltage is within the specification for the selected resistive state for the selected resistive memory cell 180 (i.e., the resistive state in which the selected resistive memory cell 180 is supposed to be in), the selected resistive memory cell 180 is identified as an operational resistive memory cell. In this case, the process proceeds to step 965. Thus, if at least one of the measured electrical current and the measured threshold voltage is within a respective specification for the selected resistive state of the selected resistive memory cell 180, the write verification program controller does not perform step 950, and the selected resistive memory cell 180 is identified as an operational (functional) memory cell.

If the measured threshold voltage is out of the specification for the selected resistive state for the selected resistive memory cell 180 (i.e., the resistive state in which the selected resistive memory cell 180 is supposed to be in), the write verification program controller performs step 950. At step 950, the selected resistive memory cell 180 is identified (marked) as a non-functional (non-operational) resistive memory cell. Thus, the selected resistive memory cell 180 is identified as a non-functional resistive memory cell if both the measured electrical current and the measured threshold voltage are outside the respective specifications for the selected resistive state. Subsequently, step 965 is performed.

The combination of step 935 and step 945 performs a combination of a read current verification test and the threshold voltage test. If the selected resistive memory cell 180 passes either of the read current verification test or the threshold voltage test, the process proceeds to step 965 without performing step 950. If the selected resistive memory cell 180 fails both the read current verification test and the threshold voltage test, the process proceeds to step 950 and then proceeds to step 965.

At step 965, the write verification program controller checks the index of the selected resistive memory cell 180 to determine if the selected resistive memory cell 180 is the last resistive memory cell to be checked for the write verification process. If the selected resistive memory cell 180 is not the last resistive memory cell to be checked for the write verification process, the process flow proceeds to step 970 at which the next resistive memory cell 180 is selected by incrementing the index for cell selection by 1. Subsequently, the process flow proceeds to step 935.

By repeatedly performing steps 935, 945, 950, 965, and 970, each resistive memory cell 180 within a plurality of resistive memory cells 180 that are programmed during the write operation can be sequentially selected to determine the functionality as a resistive memory cell. An automated program residing in the write verification program controller can be employed to repeatedly perform steps 935, 945, 950, 965, and 970. The automated program may be hard-coded into the write verification program controller. Alternatively, the automated program software may be loaded into a special purpose hardware configured to run the automated program. Such special purpose hardware may be integrated with the sense amplifier circuitry, and may be integrated with the threshold voltage extraction circuitry. The automated program can be run on each selected resistive memory cell 180 as the index for the selected resistive memory cell 180 runs from the initial number to the final number.

If the write verification program controller determines that the selected resistive memory cell 180 is the last resistive memory cell to be checked for the write verification process, the process flow proceeds to step 980. Remedial steps for data allocated to the non-functional resistive memory cells 180 can be performed. For example, a list of non-functional resistive memory cells can be generated by running the automated program on each resistive memory cell within the plurality of resistive memory cells. Such a list can be generated cell by cell by amending a pre-existing list (which does not contain any entry initially) at each occurrence of step 950. By the time the process flow proceeds to step 980, the list of non-functional resistive memory cells 180 among the programmed set of resistive memory cells 180 is complete. Data assigned to the non-functional resistive memory cells 180 can be re-routed and written to an additional set of resistive memory cells, which may be redundant resistive memory cells that are built into the array of resistive memory cells or additional memory cells provided otherwise.

Subsequently, the process flow proceeds to step 990, at which the write operation and the write verification operation are completed.

Figure 11:
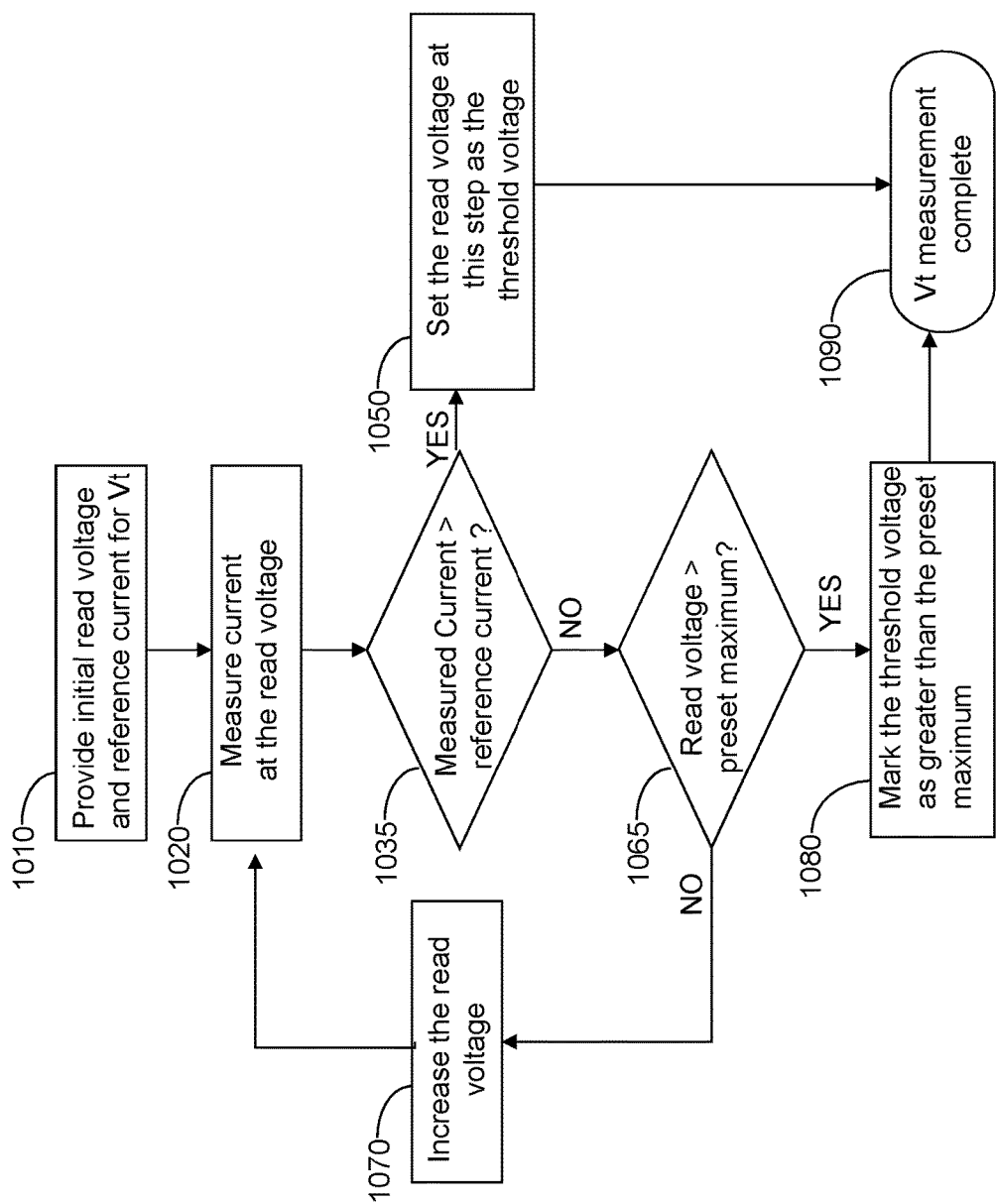
FIG. 11 is a flow diagram for an exemplary method for determining the threshold voltage of a serial connection of a selected resistive memory device and an access transistor connected thereto.

The determination of the threshold voltage for the selected resistive state (i.e., the resistive state that the selected resistive memory cell 180 is supposed to be in) can be performed using any suitable method. FIG. 11 shows an exemplary method for determination of the threshold voltage for the threshold voltage test step 945 of FIG. 10 for a serial connection of a selected resistive memory device and an access transistor connected thereto. The threshold voltage extraction circuitry can be employed in conjunction with the write verification program controller.

Referring to step 1010, the initial read voltage and reference current for the threshold voltage measurement is provided (e.g., retrieved from a look-up table or determined based on the selected resistive state of the resistive memory cell 180). For example, if the selected resistive state is a low resistance state (set state), then the initial read voltage may be the minimum threshold voltage for the set state Vts_1, and if the selected resistive state is a high resistance state (reset state), then the initial read voltage may be the minimum threshold voltage for the reset state Vtr_1. The reference current is the electrical current level that corresponds to the threshold voltage.

At step 1020, the cell current is measured at the initial read voltage.

The process flow proceeds to step 1035. If the measured cell current at the initial read voltage is exceeds the reference current, the threshold voltage is out of specification because the threshold voltage is lower than the minimum threshold voltage for the set state Vts_1 (for a set state) or lower than the minimum threshold voltage for the reset state Vtr_1 (for a reset state). In this case, the process flow can proceed to step 1050, and the previous read voltage can be set as the threshold voltage (which is out of specification). Then, the process flow proceeds to step 1090, at which the threshold voltage measurement is complete.

If the measured cell current at the initial read voltage is less than the reference current, the process flow proceeds to step 1065. At step 1065, the threshold voltage extraction circuitry and the write verification program controller determine if the read voltage (as used in the preceding measurement) is greater than a preset maximum voltage for measurement purposes. The present maximum voltage for measurement purposes may be, for example, the maximum threshold voltage for the set state Vts_h (if the selected resistive state is a low resistance state (set state)), or the maximum threshold voltage for the reset state Vtr_h (if the selected resistive state is a high resistance state (reset state)). If the read voltage is greater than the preset maximum voltage for measurement purposes (which can happen only after steps 1065 are performed multiple times), the process flow proceeds to step 1080.

At step 1080, the threshold voltage is marked to be greater than the preset maximum, and thus, is out of specification. Then, the process flow proceeds to step 1090.

If the read voltage is less than the preset maximum voltage for measurement purposes at step 1065, the process flow proceeds to step 1070. The read voltage is incremented by one voltage increment (which may be in a range from 1/100 to 1/10 of the specification range for the threshold voltage for the respective resistive state), and the process flow proceeds to step 1020.

At step 1020, the cell current is measured at the modified read voltage.

The process flow proceeds to step 1035. If the measured cell current at the modified read voltage is equal to, or exceeds, the reference current, the process flow can proceed to step 1050, and the previous read voltage can be set as the threshold voltage (which is with specification). Then, the process flow proceeds to step 1090, at which the threshold voltage measurement is complete.

If the measured cell current at the modified read voltage is less than the reference current, the process flow proceeds to step 1065.

The method of FIG. 11 is an illustrative example for determining (e.g., measuring) the threshold voltage of a series connection of a selected resistive memory cell 180 and an access transistor, and any other method for determining the threshold voltage from a series connection of a selected resistive memory cell 180 and an access transistor may be alternatively employed.

The methods of the present disclosure can be implemented by providing a resistive memory device. In this case, the resistive memory device can include: an array of resistive memory cells 180, wherein each of the resistive memory cells 180 comprises a resistive memory material having at least two different resistive states; a sense amplifier circuitry configured to detect a resistive state of each resistive memory cell 180 within the array of resistive memory cells 180 based on measurement of electrical current through a respective resistive memory cell 180 upon application of a read bias voltage to the array of resistive memory cells 180; a threshold voltage extraction circuitry configured to determine a threshold voltage for each selected resistive memory cell 180 among the array of resistive memory cells 180; and a write verification program controller configured to verify programmed states of a set of resistive memory cells 180 by running an automated program that operates the sense amplifier circuitry and the threshold voltage extraction circuitry. The automated program can include the steps of: determining whether a measured electrical current at a preset read voltage for a selected resistive memory cell 180 is within electrical current specification for the selected resistive state; if the measured electrical current at the preset read voltage is out of specification, the determining whether a measured threshold voltage for the selected resistive memory cell 180 is within threshold voltage specification for the selected resistive state; identifying the selected resistive memory cell 180 as an operational resistive memory cell 180 if at least one of the measured electrical current and the measured threshold voltage is within a respective specification for the selected resistive state; and identifying the selected resistive memory cell 180 as a non-functional resistive memory cell 180 if both the measured electrical current and the measured threshold voltage are outside the respective specification for the selected resistive state.

In one embodiment, the preset read voltage can be the same as a read voltage of the sense amplifier circuitry for a read operation that determines a resistive state of each of the resistive memory cells 180.

In one embodiment, the measured threshold voltage is generated by determining an electrical bias voltage across the selected resistive memory cell 180 that provides a preset level of electrical current through the selected resistive memory cell.

In one embodiment, the preset level of electrical current is less than 0.01 times a maximum current electrical current specification for a high resistive reset state for each of the resistive memory cells 180 within the array of resistive memory cells 180.

In one embodiment, the write verification program controller is configured to select the set of resistive memory cells 180 as an entire set of resistive memory cells 180 on which a write operation was previously performed.

In one embodiment, the write verification program is configured to sequentially select each resistive memory cell 180 within the set of resistive memory cells 180, and is configured to run the automated program on each selected resistive memory cell.

In one embodiment, the resistive memory device is configured to perform the steps of: generating a list of non-functional resistive memory cells 180 by running the automated program on each resistive memory cell 180 within the plurality of resistive memory cells 180; and rewriting data assigned to the non-functional resistive memory cells 180 to an additional set of resistive memory cells 180.

In one embodiment, each of the resistive memory cells 180 comprises a barrier modulated cell of a resistive random access memory (ReRAM) device. The barrier modulated cell comprises a metal oxide material 82 having at least two states having different resistivity, a barrier material 84 and an interfacial barrier oxide 86 located between the metal oxide material and the barrier material. In one embodiment, the metal oxide material 82 may comprise sub-stoichiometric titanium oxide ($TiO_{2-\delta}$), the barrier material 84 may comprise amorphous silicon and the interfacial barrier oxide 86 may comprise silicon oxide.

In one embodiment, programming the selected resistive memory cell 180 comprises programming the barrier modulated cell into a reset state by applying a voltage to the barrier modulated cell to provide oxygen interstitials from the interfacial barrier oxide 86 to the $TiO_{2-\delta}$ 82 and to increase a resistance of the selected resistive memory cell 180.

In another embodiment, programming the selected resistive memory cell 180 comprises programming the barrier modulated cell into a set state by applying a voltage to the barrier modulated cell to generate oxygen interstitial and oxygen vacancy pairs in the $TiO_{2-\delta}$ 82 and to provide oxygen interstitials away from the $TiO_{2-\delta}$ 82 to the interfacial barrier oxide 86 and to decrease a resistance of the selected resistive memory cell 180.

The methods of the present disclosure can increase utilization of resistive memory cells 180 by identifying resistive memory cells 180 that have a high probability of providing correct reading upon normal sensing of the resistive state even though they did not pass the read current verification test after a programming (i.e., writing) step. Measurement and analysis of the threshold voltage is performed on the resistive memory cells 180 that fails the read current verification test, thereby avoiding requirement for extensive measurement of threshold voltages which decreases processing speed. A threshold voltage within specification is considered to be a reliable indicator of functionality of the resistive memory cell 180 that fails the read current verification test, and the corresponding resistive memory cell 180 is considered to be a functional resistive memory cell, thus increasing the number of functional resistive memory cells that can store data.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of operating a resistive memory device, comprising:
   providing a resistive memory device including an array of resistive memory cells, wherein each of the resistive memory cells comprises a resistive memory material having at least two different resistive states;
   programming a selected resistive memory cell with a selected resistive state; and
   verifying a programmed state of the selected resistive memory cell by:
      determining whether a measured electrical current at a preset read voltage for the selected resistive memory cell is within electrical current specification for the selected resistive state;
      if the measured electrical current at the preset read voltage is out of specification, then iteratively applying a plurality of modified read voltages across the selected resistive memory cell and selecting a modified read voltage that provides a preset level of electrical current through the selected resistive memory cell as a measured threshold voltage, and then determining whether the measured threshold voltage for the selected resistive memory cell is within threshold voltage specification for the selected resistive state;
      identifying the selected resistive memory cell as an operational resistive memory cell if at least one of the measured electrical current and the measured threshold voltage is within a respective specification for the selected resistive state; and
      identifying the selected resistive memory cell as a non-functional resistive memory cell if both the measured electrical current and the measured threshold voltage are outside the respective specification for the selected resistive state;
   wherein:
      the selected resistive memory cell comprises a barrier modulated cell of a resistive random access memory (ReRAM) device; and
      the barrier modulated cell comprises a metal oxide material having at least two states having different resistivity, a barrier material and an interfacial barrier oxide located between the metal oxide material and the barrier material.

2. The method of claim 1, wherein the preset read voltage is the same as a read voltage for a read operation that determines a resistive state of each of the resistive memory cells.

3. The method of claim 1, wherein the preset level of electrical current is less than 0.01 times a maximum reset verification current threshold for a high resistive reset state for each of the resistive memory cells within the array of resistive memory cells.

4. The method of claim 1, further comprising:
   programming a plurality of resistive memory cells with a respective selected resistive state;
   sequentially selecting each resistive memory cell within the plurality of resistive memory cells;
   determining whether the measured electrical current at the preset read voltage for the plurality of resistive memory cells is within electrical current specification for the selected resistive state; and
   if the measured electrical current at the preset read voltage is out of specification for a first set of resistive memory cells of the plurality of resistive memory cells, then determining whether a measured threshold voltage for the first set of memory cells is within threshold voltage specification for the selected resistive state.

5. The method of claim 4, further comprising:
   generating a list of non-functional resistive memory cells based on the steps of determining; and
   rewriting data assigned to the non-functional resistive memory cells to an additional set of resistive memory cells.

6. The method of claim 1, wherein the metal oxide material comprises sub-stoichiometric titanium oxide ($TiO_{2-\delta}$), the barrier material comprises amorphous silicon and the interfacial barrier oxide comprises silicon oxide.

7. The method of claim 6, wherein programming the selected resistive memory cell comprises programming the barrier modulated cell into a reset state by applying a voltage to the barrier modulated cell to provide oxygen interstitials from the interfacial barrier oxide to the $TiO_{2-\delta}$ and increase a resistance of the selected resistive memory cell.

8. The method of claim 6, wherein programming the selected resistive memory cell comprises programming the barrier modulated cell into a set state by applying a voltage to the barrier modulated cell to generate oxygen interstitial and oxygen vacancy pairs in the $TiO_{2-\delta}$, and to provide oxygen interstitials away from the $TiO_{2-\delta}$ to the interfacial barrier oxide and decrease a resistance of the selected resistive memory cell.

9. A method of operating a resistive memory device, comprising:
   providing a resistive memory device including an array of resistive memory cells, wherein each of the resistive memory cells comprises a resistive memory material having at least two different resistive states;
   programming a selected resistive memory cell with a selected resistive state; and
   verifying a programmed state of the selected resistive memory cell by:
      determining whether a measured electrical current at a preset read voltage for the selected resistive memory cell is within electrical current specification for the selected resistive state;
      if the measured electrical current at the preset read voltage is out of specification, then determining whether a measured threshold voltage for the selected resistive memory cell is within threshold voltage specification for the selected resistive state;
      identifying the selected resistive memory cell as an operational resistive memory cell if at least one of the measured electrical current and the measured threshold voltage is within a respective specification for the selected resistive state; and
      identifying the selected resistive memory cell as a non-functional resistive memory cell if both the measured electrical current and the measured threshold voltage are outside the respective specification for the selected resistive state;

wherein:
the selected resistive memory cell comprises a barrier modulated cell of a resistive random access memory (ReRAM) device; and
the barrier modulated cell comprises a metal oxide material having at least two states having different resistivity, a barrier material and an interfacial barrier oxide located between the metal oxide material and the barrier material;
wherein the measured threshold voltage is generated by determining an electrical bias voltage across the selected resistive memory cell that provides a preset level of electrical current through the selected resistive memory cell;
wherein the preset level of electrical current is less than 0.01 times a maximum reset verification current threshold for a high resistive reset state for each of the resistive memory cells within the array of resistive memory cells.

10. The method of claim 9, wherein the preset read voltage is the same as a read voltage for a read operation that determines a resistive state of each of the resistive memory cells.

11. The method of claim 9, further comprising:
programming a plurality of resistive memory cells with a respective selected resistive state;
sequentially selecting each resistive memory cell within the plurality of resistive memory cells;
determining whether the measured electrical current at the preset read voltage for the plurality of resistive memory cells is within electrical current specification for the selected resistive state; and
if the measured electrical current at the preset read voltage is out of specification for a first set of resistive memory cells of the plurality of resistive memory cells, then determining whether a measured threshold voltage for the first set of memory cells is within threshold voltage specification for the selected resistive state.

12. The method of claim 11, further comprising:
generating a list of non-functional resistive memory cells based on the steps of determining; and
rewriting data assigned to the non-functional resistive memory cells to an additional set of resistive memory cells.

13. The method of claim 9, wherein the metal oxide material comprises sub-stoichiometric titanium oxide ($TiO_{2-\delta}$), the barrier material comprises amorphous silicon and the interfacial barrier oxide comprises silicon oxide.

14. The method of claim 13, wherein programming the selected resistive memory cell comprises programming the barrier modulated cell into a reset state by applying a voltage to the barrier modulated cell to provide oxygen interstitials from the interfacial barrier oxide to the $TiO_{2-\delta}$ and increase a resistance of the selected resistive memory cell.

15. The method of claim 13, wherein programming the selected resistive memory cell comprises programming the barrier modulated cell into a set state by applying a voltage to the barrier modulated cell to generate oxygen interstitial and oxygen vacancy pairs in the $TiO_{2-\delta}$ and to provide oxygen interstitials away from the $TiO_{2-\delta}$ to the interfacial barrier oxide and decrease a resistance of the selected resistive memory cell.

* * * * *